(12) United States Patent
Lim

(10) Patent No.: US 12,009,037 B2
(45) Date of Patent: Jun. 11, 2024

(54) IMPROVING RELIABILITY OF VERIFY OPERATION FOR VERIFYING PROGRAM PULSE OPERATION OF NAND FLASH MEMORY DEVICE

(71) Applicant: SK hynix Inc., Icheon-si (KR)

(72) Inventor: Sung Yong Lim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 205 days.

(21) Appl. No.: 17/670,267

(22) Filed: Feb. 11, 2022

(65) Prior Publication Data

US 2023/0090656 A1    Mar. 23, 2023

(30) Foreign Application Priority Data

Sep. 23, 2021    (KR) .................. 10-2021-0125825

(51) Int. Cl.
| | |
|---|---|
| *G11C 16/10* | (2006.01) |
| *G11C 16/04* | (2006.01) |
| *G11C 16/08* | (2006.01) |
| *G11C 16/14* | (2006.01) |
| *G11C 16/34* | (2006.01) |

(52) U.S. Cl.
CPC ...... *G11C 16/3459* (2013.01); *G11C 16/0483* (2013.01); *G11C 16/08* (2013.01); *G11C 16/10* (2013.01); *G11C 16/14* (2013.01)

(58) Field of Classification Search
CPC . G11C 16/3459; G11C 16/0483; G11C 16/08; G11C 16/10; G11C 16/14
See application file for complete search history.

(56) References Cited

U.S. PATENT DOCUMENTS

| | | | | |
|---|---|---|---|---|
| 2012/0281487 A1* | 11/2012 | Sakaniwa | ......... | G11C 16/0483 |
| | | | | 365/189.16 |
| 2013/0077408 A1* | 3/2013 | Ueno | ..................... | G11C 16/06 |
| | | | | 365/185.22 |
| 2016/0071595 A1* | 3/2016 | Dong | ................. | G11C 16/3459 |
| | | | | 365/185.17 |
| 2020/0118630 A1* | 4/2020 | Lin | ....................... | G11C 16/08 |
| 2020/0350022 A1* | 11/2020 | Choo | ..................... | G11C 16/08 |

(Continued)

FOREIGN PATENT DOCUMENTS

| | | |
|---|---|---|
| KR | 1020060108324 A | 10/2006 |
| KR | 1020170114349 A | 10/2017 |

*Primary Examiner* — Mushfique Siddique
(74) *Attorney, Agent, or Firm* — WILLIAM PARK & ASSOCIATES LTD.

(57) ABSTRACT

A memory device includes a memory block, peripheral circuit, and control logic. The memory block includes a plurality of pages coupled to a plurality of word lines, respectively. The peripheral circuit is configured to perform a program loop including a program pulse operation of applying a program voltage to a selected word line, and a verify operation of applying at least one verify voltage corresponding to the program voltage to the selected word line and applying a verify pass voltage to unselected word lines. The control logic is configured to increase a level of the verify pass voltage applied to at least one unselected word line among the unselected word lines whenever the peripheral circuit performs the next program loop when threshold voltages of memory cells included in a page coupled to the selected word line are greater than a reference level.

19 Claims, 18 Drawing Sheets

(56) References Cited

U.S. PATENT DOCUMENTS

| | | | |
|---|---|---|---|
| 2022/0068392 A1* | 3/2022 | You | G06F 3/0659 |
| 2022/0101923 A1* | 3/2022 | Park | G11C 16/10 |
| 2022/0415419 A1* | 12/2022 | Shin | G11C 16/26 |
| 2023/0058168 A1* | 2/2023 | Choi | G11C 16/26 |

* cited by examiner

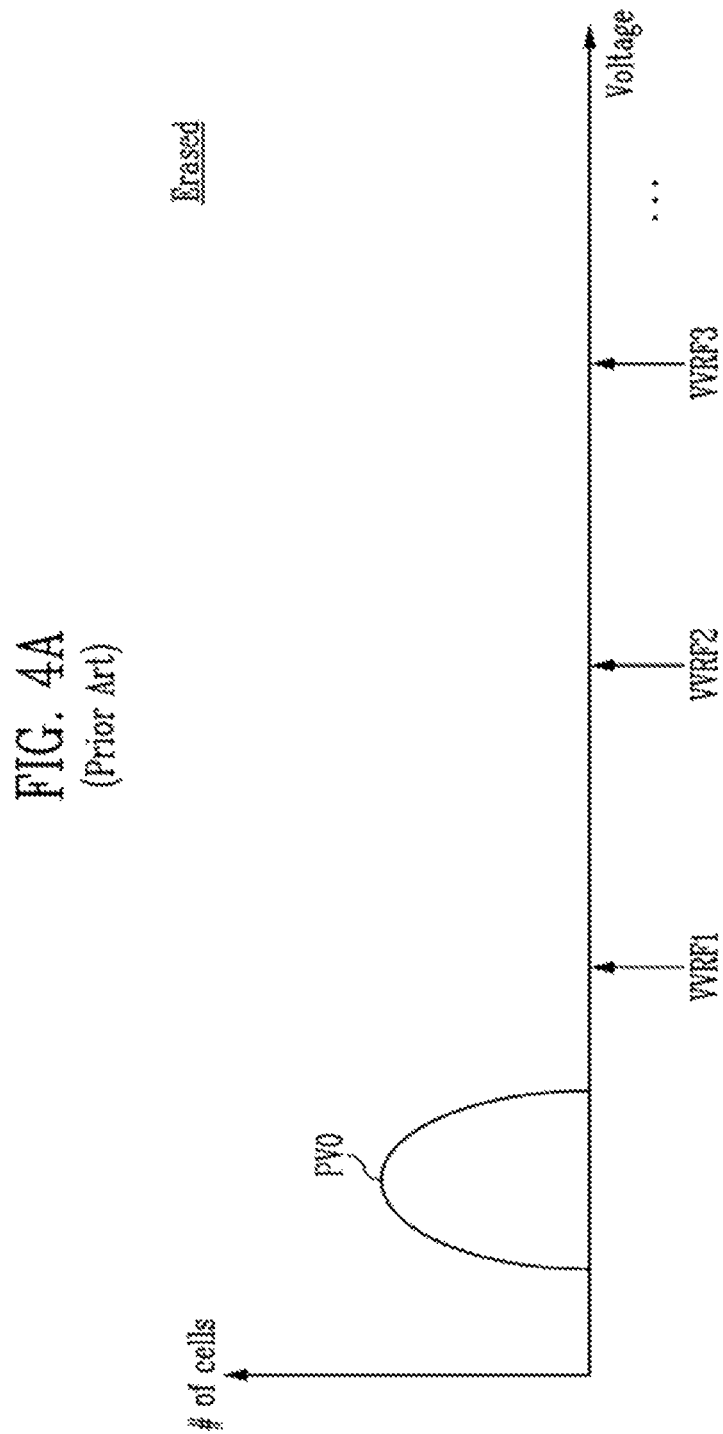

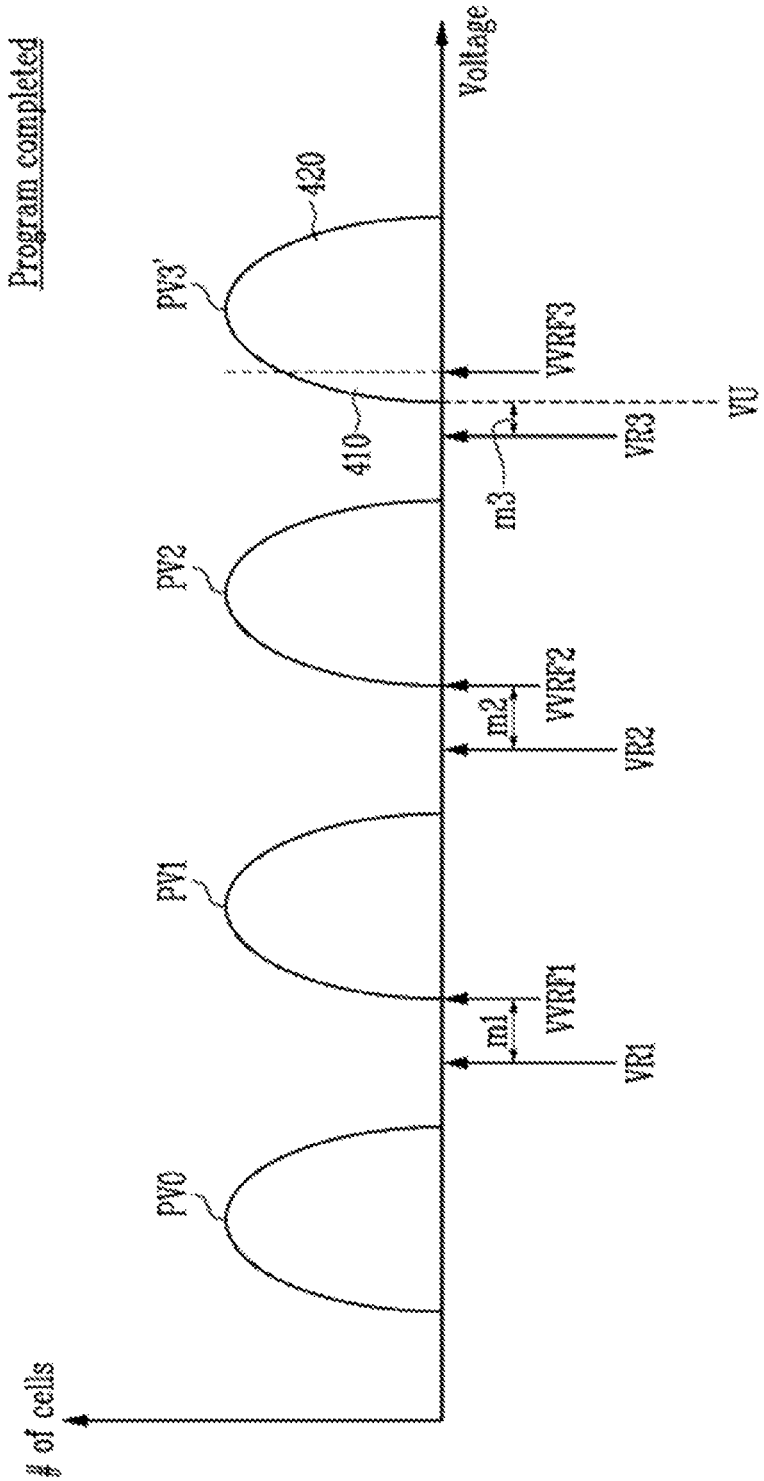

FIG. 8A

| State | MLC | TLC |
|---|---|---|
| PV0 | Low | Low |
| PV1 | Low | Low |
| PV2 | Low (Ref) | Low |
| PV3 | High | Low |
| PV4 | – | Low |
| PV5 | – | Low (Ref) |
| PV6 | – | High |
| PV7 | – | High |

IMPROVING RELIABILITY OF VERIFY OPERATION FOR VERIFYING PROGRAM PULSE OPERATION OF NAND FLASH MEMORY DEVICE

CROSS-REFERENCE TO RELATED APPLICATION

The present application claims priority under 35 U.S.C. § 119(a) to Korean patent application number 10-2021-0125825 filed on Sep. 23, 2021, in the Korean Intellectual Property Office, the entire disclosure of which is incorporated by reference herein.

BACKGROUND

1. Technical Field

Various embodiments of the present teachings relate generally to an electronic device, and more particularly, to a memory device, a memory system including the memory device, and a method of operating the same.

2. Related Art

A memory system is a device configured to store data in response to the control of a host device such as a computer or a smartphone. A memory system may include a memory device that stores data and a memory controller that controls the memory device. A memory device may be classified as a volatile memory device or a non-volatile memory device.

A volatile memory device may retain data as long as power is being supplied and may lose the stored data in the absence of supplied power. Volatile memory devices may include, for example, Static Random Access Memory (SRAM), Dynamic Random Access Memory (DRAM), and the like.

A non-volatile memory device refers to a memory device which does not lose data even in the absence of supplied power. Non-volatile memory may include, for example, read only memory (ROM), programmable ROM (PROM), electrically programmable ROM (EPROM), electrically erasable and programmable ROM (EEPROM), and flash memory.

SUMMARY

Various embodiments are directed to a memory device preventing generation of an under-programmed memory cell, a memory system including the memory device, and a method of operating the same.

According to an embodiment of the present disclosure, a memory device may include a memory block, a peripheral circuit, and control logic. The memory block includes a plurality of pages coupled to a plurality of word lines, respectively. The peripheral circuit is configured to perform a program loop including a program pulse operation of applying a program voltage to a selected word line corresponding to an address, among the plurality of word lines, and a verify operation of applying at least one verify voltage corresponding to the program voltage to the selected word line and applying a verify pass voltage to unselected word lines. The control logic is configured to control the peripheral circuit to repeatedly perform a next program loop including the program pulse operation and the verify operation until a pass signal indicating that the program pulse operation has passed according to the verify operation is received. The control logic is also configured to increase a level of the verify pass voltage applied to at least one unselected word line among the unselected word lines whenever the peripheral circuit performs the next program loop when threshold voltages of memory cells included in a page coupled to the selected word line are greater than or equal to a reference level.

According to an embodiment of the present disclosure, a memory system may include a memory device including a plurality of pages coupled to a plurality of word lines, respectively. The memory system may also include a memory controller configured to control the memory device to repeatedly perform a program loop including a program pulse operation and a verify operation when a program command and an address are received, the program pulse operation including applying a program voltage to a selected word line corresponding to the address, among the plurality of word lines, and applying a program pass voltage to unselected word lines, the verify operation including applying a verify voltage to the selected word line and applying a verify pass voltage to the unselected word lines. The memory controller may further be configured to increase a level of the program voltage applied to the selected word line and a level of the verify pass voltage applied to the unselected word lines whenever the memory device performs the program loop until a pass signal is received indicating that the program pulse operation has passed according to the verify operation.

According to an embodiment of the present disclosure, a method of operating a memory device including a memory block may include receiving a program command and an address. The method may also include performing a program pulse operation and a verify operation sequentially during a first program loop, the program pulse operation including applying a program voltage to a selected word line corresponding to the address, among a plurality of word lines coupled to a plurality of pages included in the memory block, respectively, the verify operation including applying a verify voltage corresponding to the program voltage to the selected word line and applying a verify pass voltage to unselected word lines. The method may further include performing the program pulse operation in which a level of the program voltage is increased and the verify operation in which a level of the verify pass voltage is increased sequentially during a second program loop when threshold voltages of memory cells included in a page coupled to the selected word line are greater than or equal to a reference level and less than a target level higher than the reference level.

BRIEF DESCRIPTION OF THE DRAWINGS

FIGS. 4A to 4D are diagrams illustrating a distribution of threshold voltages of memory cells;

FIG. 8A is a diagram illustrating conditions under which a verify pass voltage is changed according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Figure 1:
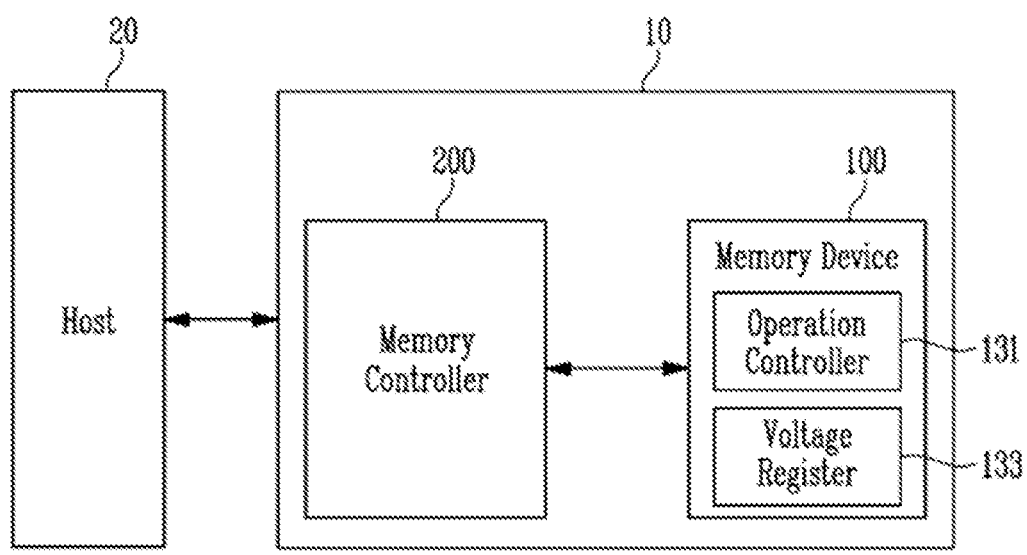
FIG. 1 is a diagram illustrating a memory system according to an embodiment of the present disclosure.

FIG. 1 is a block diagram illustrating a memory system 10 according to an embodiment of the present disclosure.

The memory system 10 may operate in response to a request from a host 20. More specifically, the memory system may perform an operation corresponding to the request received from the host 20. For example, the memory system 10 may store data in the memory system 10 when the memory system 10 receives data and a request for instruction to store data from the host 20. In another example, when the memory system 10 receives a request for instruction to read data from the host 20, the memory system 10 may provide the host 20 with the data stored in the memory system 10. The memory system 10 may be coupled to the host 20 by various communication methods.

The memory system 10 may be embodied as one of various types of storage devices according to communication standards or data storage schemes. For example, the memory system 10 may be embodied as any of the storage devices, for example, a Solid State Drive (SSD), a Multi-Media Card (MMC), an Embedded MMC (eMMC), a Reduced Size MMC (RS-MMC), a micro-MMC storage device, a Secure Digital (SD), a mini-SD or micro-SD storage device, a Universal Serial Bus (USB) storage device, a Universal Flash Storage (UFS) device, a personal computer memory card international association (PCMCIA) storage device, a peripheral component interconnection (PCI) storage device, a PCI express (PCI-E) storage device, a Network Attached Storage (NAS), and a wireless network storage device. However, these are merely examples and the present disclosure is not limited thereto. The memory system 10 may be embodied into various other types of storage devices.

The host 20 may be one of various electronic devices such as a desktop computer, a laptop computer, a mobile phone, a smartphone, a game console, and a wearable device. The host may request the memory system 10 to store, read, or delete data through communication according to various communication protocols.

The memory system 10 may serve as a main memory device or an auxiliary memory device of the host 20. The memory system 10 may be located inside or outside the host 20.

The memory system 10 may include a memory device 100 and a memory controller 200. There may be one or a plurality of memory devices 100. The memory device 100 and the memory controller 200 may be coupled to each other through a channel through which commands, addresses, or data are exchanged.

The memory device 100 may store data. The memory device 100 may be embodied as various types of semiconductor memory devices. Examples of memory used by the memory device 100 may include NAND flash memory, vertical NAND flash memory, NOR flash memory, static Random Access Memory (SRAM), dynamic RAM (DRAM), Synchronous Dynamic Random Access Memory (SDRAM), Double Data Rate Synchronous Dynamic Random Access Memory (DDR SDRAM), Low Power Double Data Rate (LPDDR) SDRAM, Graphics Dynamic Random Access Memory (GDRAM), Rambus Dynamic Random Access Memory (RDRAM), Ferroelectric RAM (FRAM), magnetoresistive RAM (MRAM), Phase Change Memory (PCM), Spin Transfer Torque Magnetoresistive RAM (STT-RAM), and Resistive RAM (ReRAM). Hereinafter, for convenience of explanation, it is assumed that the memory device 100 is a NAND flash memory device using NAND flash memory.

The memory device 100 may include a plurality of memory blocks. Each memory block may include a plurality of pages. Each of the pages may include a plurality of memory cells. A memory cell may store data in units of bits. For example, a threshold voltage of a memory cell may vary depending on the amount of charges stored therein. The threshold voltage of the memory cell may indicate a bit value of the data stored in the memory cell. A page may include memory cells on which a program operation for storing data or a read operation for reading the stored data is performed. A memory block may include memory cells on which an erase operation for erasing data is performed.

The memory controller 200 may control general operations of the memory device 100. For example, the memory controller 200 may control the memory device 100 to perform a program operation for storing data, a read operation for requesting the stored data, or an erase operation for erasing the stored data.

For example, as for a program operation, the memory controller 200 may provide a program command, an address, and data to the memory device 100. The address may refer to a physical address. When the memory device 100 receives the program command, the address, and the data from the memory controller 200, the memory device 100 may perform the program operation to store data in a page determined by the address. As for a read operation, the memory controller 200 may provide a read command and an address to the memory device 100. When the memory device 100 receives the read command and the address from the memory controller 200, the memory device 100 may perform the read operation so as to provide the memory controller 200 with data stored in a page determined by the address. As for an erase operation, the memory controller 200 may provide an erase command and an address to the memory device 100. When the memory device 100 receives an erase command and an address from the memory controller 200, the memory device 100 may perform the erase operation for erasing data stored in a memory block determined by the address.

According to an embodiment, the memory controller 200 may control the memory device 100 to perform a program operation, a read operation, or an erase operation in response to a request received from the host 20. For example, when the memory controller 200 receives a request to store, read, or erase data from the host 20, the memory controller 200 may generate a command corresponding to the received request. However, the memory controller 200 may receive a command directly from the host 20. In addition, when the memory controller 200 receives a logical address from the host 20, the memory controller 200 may convert the logical address into a physical address for a memory block or a page included in the memory device 100. The memory controller 200 may transfer the physical address along with the command to the memory device 100. Hereinafter, the physical address will be referred to simply as an "address."

According to another embodiment, the memory controller 200 may control the memory device 100 to perform a program operation, a read operation, or an erase operation regardless of the request of the host 20. For example, the memory controller 200 may control the memory device 100 to perform wear leveling, read reclaim, or garbage collection. Thus, the memory controller 200 may generate and transfer a command, an address, and data to the memory device 100.

During a program operation, the memory device 100 may apply a program voltage so that a threshold voltage of a memory cell may reach a target level corresponding to data to store. The target level may be a verify level for verifying a program state corresponding to the data to store among verify levels of a verify voltage. However, the threshold voltage of the memory cell may be programmed to a lower level than the target level. As a result, a memory cell which has a threshold voltage lower than the target level may exist. The memory cell whose threshold voltage is less than the target level may be referred to as an under-programmed memory cell. When under-programmed memory cells exist in the memory device 100, wrong data may be output or errors may occur during a read operation. More particularly, under programming may occur more frequently as the target level is higher.

According to an embodiment of the present disclosure, the memory device 100 that prevents the generation of under-programmed memory cells, the memory system 10 including the memory device 100, and an operating method thereof may be provided. A more detailed description will be made with reference to the accompanying drawings.

Figure 2:
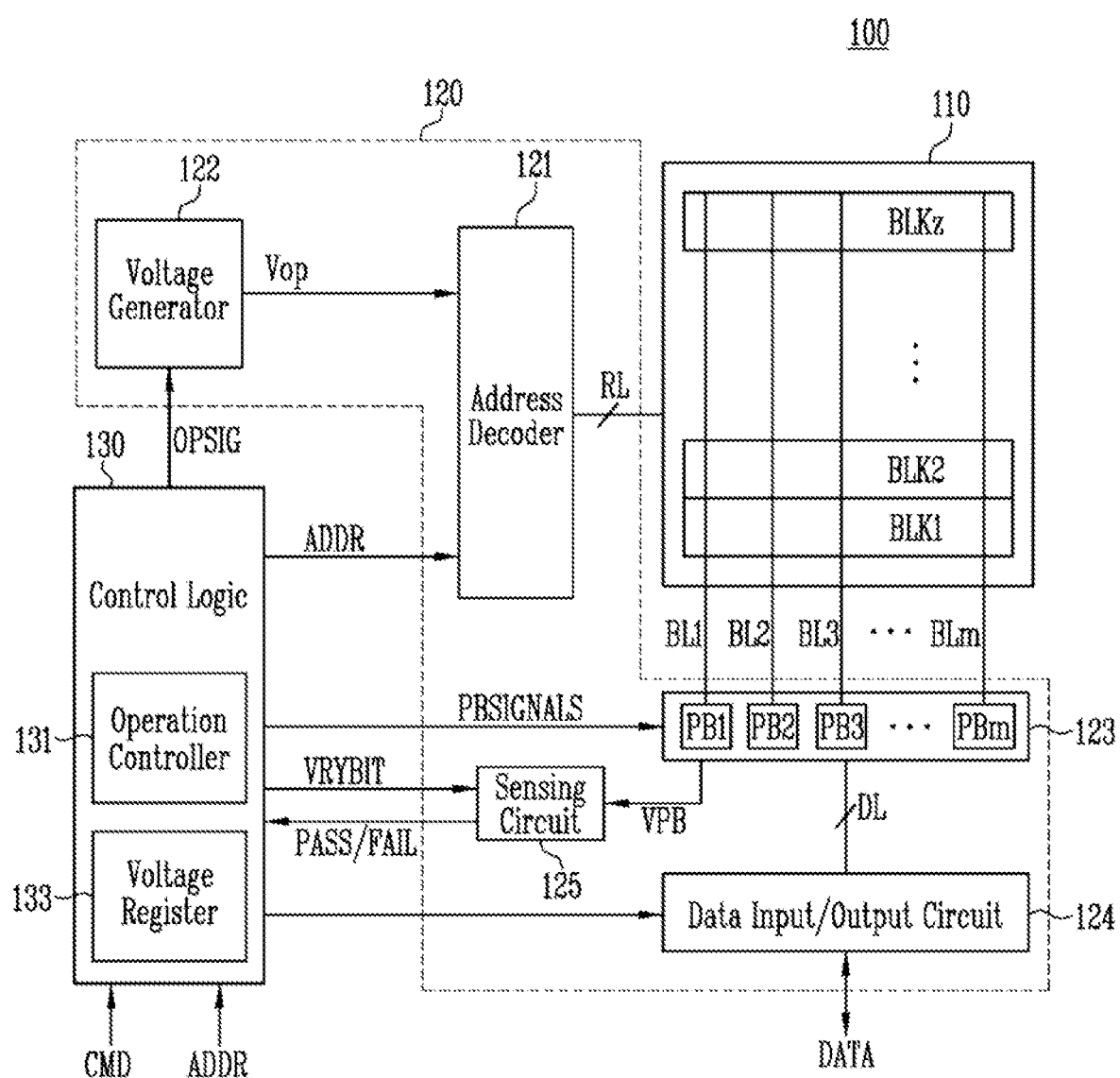
FIG. 2 is a diagram illustrating the structure of a memory device according to an embodiment of the present disclosure.

FIG. 2 is a diagram illustrating the structure of the memory device 100 according to an embodiment of the present disclosure.

Referring to FIG. 2, the memory device 100 may include a memory cell array 110, a peripheral circuit 120, and control logic 130.

The memory cell array 110 may include a plurality of memory blocks BLK1 to BLKz. Each of the memory blocks may have the same structure. Hereinafter, for convenience of explanation, one (BLKz) of the plurality of memory blocks BLK1 to BLKz will be described.

The memory block BLKz may include a plurality of pages. Each of the pages may include a plurality of memory cells. In other words, the memory block BLKz may include a plurality of memory cells.

The plurality of memory cells may be arranged in a two-dimensional plane, or may have a three-dimensional vertical structure. Each of the memory cells may be a semiconductor memory device. According to an embodiment, a memory cell may be a non-volatile memory device. A threshold voltage of a memory cell may belong to one program state, among a plurality of program states. A program state may indicate a voltage range (or section), and a specific value of data may be mapped to the program state according to a data storage scheme or a gray code. The number of program states may vary depending on the data storage scheme. For example, one memory cell may store data according to various data storage schemes including a single-level cell (SLC) storage scheme for storing 1-bit data, a multi-level cell (MLC) storage scheme for storing 2-bit data, a triple-level cell (TLC) storage scheme for storing 3-bit data, and a quad-level cell (QLC) storage scheme for storing 4-bit data.

The memory block BLKz may be coupled to an address decoder 121 of the peripheral circuit 120 through a row line RL. The row line RL may include a plurality of word lines. One page in the memory block BLKz may be coupled to one word line. In other words, memory cells included in one page of the memory block BLKz may be coupled to one word line. Each of the pages included in the memory block BLKz may be coupled to bit lines BL1 to BLm. The bit lines BL1 to BLm may be coupled to page buffers PB1 to PBm of the peripheral circuit 120, respectively. The structure of the memory block BLKz will be described in more detail with reference to FIG. 3.

The peripheral circuit 120 may operate in response to the control of the control logic 130. For example, the peripheral circuit 120 may drive the memory cell array 110 to perform a program operation, a read operation, or an erase operation.

The program operation may be performed by an Incremental Step Pulse Program (ISPP) method in which a program voltage gradually increases. More specifically, the peripheral circuit 120 may perform a program loop which includes a program pulse operation and a verify operation. The program pulse operation and the verify operation may be performed in a sequential manner. According to a result of the verify operation, the peripheral circuit 120 may perform a next program loop, or may terminate the operation after a level of the program voltage is increased.

The program pulse operation may refer to an operation of adjusting threshold voltages of memory cells included in a selected page so that the memory cells may have a predetermined program state. The verify operation may be performed to verify whether the program pulse operation passes or fails. For example, when the program pulse operation passes, it may mean that threshold voltages of the memory cells included in the selected page are greater than or equal to the target level, and when the program pulse operation fails, it may mean that at least one of the threshold voltages of the memory cells included in the selected page is less than the target level.

For example, the program pulse operation may include applying a program voltage to the selected page or the selected word line. In addition, the program pulse operation may include applying a program pass voltage to unselected pages or unselected word lines while the program voltage is applied to the selected page or the selected word line. The program voltage may be applied to increase a threshold voltage of a memory cell. The program pass voltage may be applied to form a channel in which the current flows. The program voltage may have a higher voltage level than the program pass voltage.

For example, the verify operation may include applying a verify voltage to the selected page or the selected word line. In addition, the verify operation may include applying a verify pass voltage to unselected pages or unselected word lines while the verify voltage is applied to the selected page or the selected word line. The verify voltage may be applied to determine whether the program pulse operation (or the program operation) passes or fails. The verify pass voltage may be applied to form a channel in which the current flows. The verify voltage may have a lower voltage level than the verify pass voltage.

The selected word line may be determined by an address, among the plurality of word lines, and the selected page may be coupled to the selected word line among the plurality of pages. The address may include at least one of a block address and a page address. In addition, the unselected word line may refer to the remaining word line, except for the selected word line, among the plurality of word lines coupled to the memory block to which the selected word line is coupled, and the unselected page may refer to a page coupled to the unselected word line among the plurality of pages included in the memory block coupled to the selected word line.

According to an embodiment, the peripheral circuit 120 may include the address decoder 121, a voltage generator 122, a read and write circuit 123, a data input/output circuit 124, and a sensing circuit 125.

The address decoder 121 may be coupled to the memory cell array 110 through the row line RL. For example, referring to FIGS. 2 and 3, the row line RL may include a drain select line DSL, a plurality of word lines WL1 to WL16, a source select line SSL, and a source line SL. For example, the address decoder 121 may include components such as a row decoder, a column decoder, and an address buffer.

The address decoder 121 may operate in response to control of the control logic 130. For example, the address decoder 121 may receive an address ADDR from the control logic 130. The address decoder 121 may decode a block address or a page address included in the received address ADDR. The page address may indicate a row address. The address decoder 121 may apply an operating voltage Vop provided from the voltage generator 122 to a selected memory block determined by the block address among the memory blocks BLK1 to BLKz. The address decoder 121 may apply the operating voltage Vop provided from the voltage generator 122 to a selected page determined by the page address among the pages included in the selected memory block determined by the block address. The operating voltage Vop may include at least one of the program voltage, the verify voltage, the program pass voltage, the verify pass voltage, a read voltage, a read pass voltage, and first and second erase voltages.

According to an embodiment, during a program pulse operation, the address decoder 121 may apply a program voltage to a selected page (or a selected word line) determined by the page address among pages included in a selected memory block determined by the block address (or word lines coupled to the selected memory block), and may apply a program pass voltage to an unselected page (or an unselected word line). The program voltage may have a higher voltage level than the program pass voltage. During a program verify operation, the address decoder 121 may apply a verify voltage to a selected page (or a selected word line) determined by the page address among pages included in a selected memory block determined by the block address (or word lines coupled to the selected memory block), and may apply a verify pass voltage to an unselected page (or an unselected word line). The verify voltage may have a lower voltage level than the verify pass voltage.

According to an embodiment, during a read operation, the address decoder 121 may apply a read voltage to a selected page (or a selected word line) determined by the page address among pages included in a selected memory block determined by the block address (or word lines coupled to the selected memory block), and may apply a read pass voltage to an unselected page (or an unselected word line). The read voltage may have a lower voltage level than the read pass voltage. In another example, during an erase operation, the address decoder 121 may apply the first erase voltage to word lines coupled to a selected memory block and may apply a second erase voltage having a higher voltage level than the first erase voltage to a substrate in which memory cells included in the selected memory block are stacked.

The voltage generator 122 may generate various types of operating voltages Vop by using an external power which is supplied to the memory device 100. The external power may be an auxiliary power supply which is included in the memory system 10, or may be a power supply which is provided from the host 20. For example, the voltage generator 122 may generate a program voltage, a verify voltage, a program pass voltage, a verify pass voltage, a read voltage, a read pass voltage, and first and second erase voltages by using the external power supplied to the memory device 100.

The voltage generator 122 may operate in response to control of the control logic 130. For example, when the voltage generator 122 receives an operating signal OPSIG from the control logic 130, the voltage generator 122 may transfer the operating voltages Vop corresponding to the operating signal OPSIG to the address decoder 121.

The read and write circuit 123 may include the plurality of page buffers PB1 to PBm. The plurality of page buffers PB1 to PBm may be coupled to the memory cell array 110 through the plurality of bit lines BL1 to BLm corresponding thereto, respectively. For example, each of the plurality of page buffers PB1 to PBm may be commonly coupled to memory cells indicating a predetermined column, among memory cells included in each of the plurality of memory blocks BLK1 to BLKz, through one bit line. Each of the page buffers PB1 to PBm may temporarily store data DATA. Each of the page buffers PB1 to PBm may be embodied as various types of memory devices such as a latch circuit.

The read and write circuit 123 may operate in response to control of the control logic 130. For example, when the read and write circuit 123 receives a buffer control signal PBSIGNALS from the control logic 130, the read and write circuit 123 may apply a voltage corresponding to the data DATA to the memory cell array 110 through the plurality of bit lines BL1 to BLm, or may read the data DATA stored in the memory cell array 110 through the plurality of bit lines BL1 to BLm.

The data Input/output circuit 124 may be coupled to the read and write circuit 123 through a data line DL. The data input/output circuit 124 may include a plurality of input/output buffers that receive the data DATA being input. The data input/output circuit 124 may operate in response to control of the control logic 130. For example, when the data input/output circuit 124 receives the control signal from the control logic 130, the data input/output circuit 124 may transfer the data DATA to the read and write circuit 123 through the data line DL, or may output the data DATA to the memory controller 200 through a channel.

The sensing circuit 125 may generate a reference voltage in response to an allowable bit VRYBIT signal which is received from the control logic 130. The sensing circuit 125 may output a pass signal PASS or a fail signal FAIL as a result of comparing the reference voltage with a sensing voltage VPB which is received from the read and write circuit 123. The pass signal PASS may indicate that the program pulse operation or the read operation has passed. The fail signal FAIL may indicate that the program pulse operation or the read operation has failed.

According to an embodiment, during a program pulse operation, the data input/output circuit 124 may receive the data DATA to be stored in the selected page from the memory controller 200. The data input/output circuit 124 may transfer the data DATA to the plurality of page buffers PB1 to PBm included in the read and write circuit 123. Each of the page buffers PB1 to PBm may receive the data DATA from the data input/output circuit 124. Each of the page buffers PB1 to PBm may temporarily store the receive data DATA. In addition, when the program voltage is applied to the selected page and the program pass voltage is applied to the unselected pages, each of the page buffers PB1 to PBm may apply a voltage corresponding to the data DATA to a bit line coupled thereto among the plurality of bit lines BL1 to BLm.

During a verify operation, when the verify voltage is applied to the selected page and the verify pass voltage is applied to the unselected pages, the plurality of page buffers PB1 to PBm may sense voltages or currents in the plurality of bit lines BL1 to BLm. The plurality of page buffers PB1 to PBm may store sensing data corresponding to the sensed voltages or currents. The plurality of page buffers PB1 to PBm may transfer the sensing voltage VPB corresponding to the sensing data to the sensing circuit 125. The sensing circuit 125 may output the pass signal PASS or the fail signal FAIL. When the control logic 130 receives the pass signal PASS from the sensing circuit 125, the control logic 130 may output the pass signal PASS to the memory controller 200. In addition, when the control logic 130 receives the pass signal PASS from the sensing circuit 125, the control logic 130 may control the read and write circuit 123 to erase the data DATA stored in each of the page buffers PB1 to PBm. On the other hand, when the control logic 130 receives the fail signal FAIL from the sensing circuit 125, the control logic 130 may control the peripheral circuit 120 to perform the next program pulse operation by increasing the level of the program voltage.

According to an embodiment, during a read operation, when the read voltage is applied to the selected page and the read pass voltage is applied to the unselected pages, the plurality of page buffers PB1 to PBm may sense voltages or currents in the plurality of bit lines BL1 to BLm. The plurality of page buffers PB1 to PBm may store the data DATA corresponding to the sensed voltages or currents. The data DATA may refer to the data DATA stored in the selected page. The plurality of page buffers PB1 to PBm may transfer the data DATA to the data input/output circuit 124 through the data line DL. The data input/output circuit 124 may receive the data DATA from the plurality of page buffers PB1 to PBm through the data line DL. The data input/output circuit 124 may output the data DATA to the memory controller 200.

The control logic 130 may control the general operations of the memory device 100. The control logic 130 may be implemented as hardware, software, or a combination of hardware and software. For example, the control logic 130 may be a control logic circuit operating in accordance with an algorithm and/or a processor executing control logic code. The control logic 130 may control the peripheral circuit 120 to perform a program operation, a read operation, or an erase operation according to a command CMD and the address ADDR received from the memory controller 200. The command CMD may be a program command, a read command, or an erase command. The control logic 130 may be coupled to the peripheral circuit 120. For example, the peripheral circuit 130 may include the address decoder 121, the voltage generator 122, the read and write circuit 123, the data input/output circuit 124, and the sensing circuit 125.

According to an embodiment, the control logic 130 may provide various signals corresponding to the command CMD and the address ADDR, which are received from the memory controller 200, to the peripheral circuit 120. The command CMD may be one of the program command, the read command, and the erase command. For example, the control logic 130 may generate the operating signal OPSIG, the buffer control signal PBSIGNALS, and the allowable bit VRYBIT. The control logic 130 may output the operating signal OPSIG to the voltage generator 122, output the address ADDR to the address decoder 121, output the buffer control signal PBSIGNALS to the read and write circuit 123, and output the allowable bit VRYBIT to the sensing circuit 125. In addition, the control logic 130 may determine whether an operation passes or fails, based on the pass signal PASS or the fail signal FAIL received from the sensing circuit 125.

According to an embodiment, when the control logic 130 receives a program command and an address, the control logic 130 may control the peripheral circuit 120 to perform a program operation. The program operation may be performed by an ISPP method in which the program voltage gradually increases.

More specifically, when the control logic 130 receives the program command and the address, the control logic 130 may control the peripheral circuit 120 to perform a program loop including a program pulse operation and a verify operation. The program pulse operation and the verify operation may be performed in a sequential manner. For example, the verify operation may be performed after the program pulse operation is performed.

As a result of the verify operation, the control logic 130 may control the peripheral circuit 120 to perform the next program loop in which the level of the program voltage is performed, or may terminate the operation. More specifically, the control logic 130 may receive the fail signal FAIL or the pass signal PASS from the sensing circuit 125 of the peripheral circuit 120 according to the verify operation.

According to an embodiment, when the control logic 130 receives the fail signal FAIL which indicates that the program pulse operation has failed, the control logic 130 may control the peripheral circuit 120 to perform the next program loop. The next program loop may include a program pulse operation and a verify operation which are performed in a sequential manner. The level of the program voltage for the program pulse operation included in the next program loop may be increased to be greater than or equal to that of the program voltage in the previous program loop. In addition, the level of the verify pass voltage of the verify operation included in the next program loop may be maintained, or increased.

According to an embodiment, when the control logic 130 receives the pass signal PASS which indicates that the program pulse operation has passed, the control logic 130 may terminate the program operation.

The control logic 130 may include an operation controller 131 and a voltage register 133.

The operation controller 131 may control the peripheral circuit 120 to perform a program operation, a read operation, or an erase operation according to the command CMD and the address ADDR.

During a program operation, the operation controller 131 may control the peripheral circuit 120 to perform a program loop which includes a program pulse operation and a verify operation. The operation controller 131 may control the peripheral circuit 120 to repeatedly perform the next program loop until the operation controller 131 receives the pass signal PASS indicating that the program pulse operation has passed. In other words, the operation controller 131 may control the peripheral circuit 120 to repeat the next program loop until the program pulse operation passes.

More specifically, for example, as a result of the verify operation, the operation controller 131 may terminate the program operation when the operation controller 131 receives the pass signal PASS, and may control the peripheral circuit 120 to perform the next program loop when the operation controller 131 receives the fail signal FAIL. When the peripheral circuit 120 performs the next program loop, the operation controller 131 may control the peripheral circuit 120 to terminate the program operation upon reception of the pass signal PASS and then perform the next program loop upon receipt of the fail signal FAIL according to the verify operation. As described above, whenever the operation controller 131 receives the fail signal FAIL, the operation controller 131 may control the peripheral circuit 120 to perform the next program loop. The program loop may be repeated within a range of a predetermined number of times.

The operation controller 131 may increase the level of the program voltage of the program pulse operation whenever the next program loop is repeated. The operation controller 131 may control the peripheral circuit 120 to perform a program pulse operation of the next program loop in which the level of the program voltage is increased. In other words, the level of the program voltage may be gradually increased as the number of program loops is increased.

It may be determined that the program pulse operation has passed although the threshold voltages of the memory cells do not reach the target level (or target state) due to source line bouncing or the like. For example, when the current or voltage of the source line is changed due to source line bouncing, a threshold voltage of a memory cell may be determined as a different level. As a result, the reliability of the verify operation may be deteriorated, and the reliability of data may be deteriorated.

To prevent an under-program phenomenon, the operation controller 131 may increase the level of the verify pass voltage of the verify operation whenever the next program loop is repeated. The operation controller 131 may control the peripheral circuit 120 to perform a verify operation of the next program loop in which the level of the verify pass voltage is increased. In other words, the level of the verify pass voltage may be gradually increased as the number of program loops is increased.

According to an embodiment, the operation controller 131 may increase the level of the verify pass voltage which is applied to the unselected word line when the threshold voltages of the memory cells included in the page coupled to the selected word line are greater than or equal to a reference level.

The reference level may be one of the predetermined verify levels among the verify levels of the verify voltage. The verify level of the verify voltage may be set beforehand so as to verify a program state of a memory cell on which the program pulse operation is performed. The reference level and the verify level may be stored in the voltage register 133.

The reference level may be a verify level which is set to differentiate a high program state from a low program state among program states. As a program state is higher, an under-program phenomenon may be more likely to occur. As for a program loop having a high program state, the level of the verify pass voltage may be gradually increased.

For example, when a data storage scheme corresponds to a multi-level cell, the reference level may be set to a verify level of a verify voltage for verifying a third program state which is the second highest one among first to fourth program states. In another example, when the data storage scheme corresponds to a triple-level cell, the reference level may be set to a verify level of a verify voltage for verifying a sixth program state which is the third highest one among first to eighth program states. However, these are merely examples, and the reference level may vary.

The operation controller 131 may increase the level of the verify pass voltage which is applied to one unselected word line among the unselected word lines when the threshold voltages of the memory cells included in the page coupled to the selected word line are greater than or equal to the reference level.

According to an embodiment, the at least one unselected word line, to which the verification pass voltage of the increased level is applied, may include at least one adjacent word line located within a predetermined distance based on a position of the selected word line from among the plurality of word lines. The predetermined distance may be a value obtained by multiplying a predetermined number by an offset value. The offset value may be a distance between two word lines adjacent to each other. The predetermined number may be a natural number of 1 or more. For example, when the predetermined number is 1 and an Nth word line is selected, the operation controller 131 may increase the level of the verify pass voltage which is applied to each of an (N−1)th word line and an (N+1)th word line which are adjacent to the Nth word line. For example, when the predetermined number is 2 and an Nth word line is selected, the operation controller 131 may increase the level of the verify pass voltage which is applied to each of an (N−2)th word line, the (N−1)th word line, the (N+1)th word line and an (N+2)th word line which are adjacent to the Nth word line. However, this is merely one example, and the predetermined number may vary.

According to an embodiment, the at least one unselected word line, to which the verification pass voltage of the increased level is applied, may be the remaining word lines except for the selected word line among the plurality of word lines. The operation controller 131 may increase the level of the verify pass voltage which is applied to the remaining word lines except for the selected word line when the threshold voltages of the memory cells included in the page coupled to the selected word line are greater than or equal to the reference level. For example, when one memory block includes 100 pages (or there are 100 word lines coupled to pages), the operation controller 131 may increase the level of the verify pass voltage applied to each of the 99 word lines, except for the selected word line.

According to an embodiment, the operation controller 131 may maintain the level of the verify pass voltage when the threshold voltages of the memory cells included in the page coupled to the selected word line are less than the reference level. The operation controller 131 may control the peripheral circuit 120 to perform a verify operation of the next program loop in which the level of the verify pass voltage is maintained. As for a program loop having a low program state, the level of the verify pass voltage may be maintained.

According to an embodiment, the operation controller 131 may adjust a voltage increase on the basis of the number of program-completed pages among the plurality of pages included in the memory block. The voltage increase may indicate a degree to which the level of the verify pass voltage applied to the unselected word line is increased in the next program loop. When the threshold voltages of the memory cells included in the page coupled to the selected word line are greater than or equal to the reference level, the operation controller 131 may increase the level of the verify pass voltage by the voltage increase whenever the next program loop is performed.

According to an embodiment, when a ratio of the number of program-completed pages and the number of pages is less than a reference value, the operation controller 131 may maintain a value of the voltage increase. In other words, when the ratio is less than the reference value, the operation controller 131 may apply a predetermined value as the value of the voltage increase. The ratio may refer to a degree in which the program operation is performed on one memory block. The reference value may refer to a basis on which the value of the voltage increase is adjusted based on the progress of the programming of one memory block. The reference value may be set beforehand. For example, the reference value may be 0.7 or 70%. However, the reference value may vary.

According to an embodiment, when a ratio of the number of program-completed pages and the number of pages is greater than or equal to the reference value, the operation controller 131 may maintain the value of the voltage increase according to the difference between the ratio and the reference value. For example, when the ratio is greater than or equal to the reference value, the operation controller 131 may increase the value of the voltage increase in proportion to the difference between the ratio and the reference value.

According to an embodiment, when the ratio of the number of program-completed pages and the number of pages is less than the reference value, the operation controller 131 may adjust the value of the voltage increase to a value obtained by multiplying the difference between the ratio and the reference value by a first gradient. In addition, when the ratio of the number of program-completed pages and the number of pages is greater than or equal to the reference value, the operation controller 131 may adjust the value of the voltage increase to a value obtained by multiplying the difference between the ratio and the reference value by a second gradient. The second gradient may have a greater value than the first gradient.

According to an embodiment, when the threshold voltages of the memory cells included in the page coupled to the selected word line are greater than or equal to a reference verify voltage having a lower level than a target verify voltage, the operation controller 131 may increase the level of the verify pass voltage applied to the word line coupled to the program-completed page, among the unselected word lines, by a first increase whenever the operation controller 131 performs a program loop. In addition, the operation controller 131 may increase the level of the verify pass voltage applied to the word line coupled to the erased page, among the unselected word lines, by a second increase. The second increase may have a smaller value than the first increase. However, this is merely an example. The second increase may be changed to a value greater than or equal to the first increase.

According to an embodiment, the operation controller 131 may control the peripheral circuit 120 to apply the program pass voltage to the unselected word line during the program pulse operation.

The voltage register 133 may store voltage information. The voltage information may include information about levels of voltages which are used in each of the plurality of program loops. According to an embodiment, the voltage information may include the levels of the program voltage, the verify voltage and the verify pass voltage for each of the plurality program loops. In addition, the voltage information may further include a level of the program pass voltage with respect to each of the plurality of program loops. The voltage information may be presented in a tabular format. However, this is a mere embodiment. The voltage information may be modified into various types of information.

According to a modification, at least one of the operations of each of the operation controller 131 and the voltage register 133 may be performed by a separate configuration outside the control logic 130.

According to the above-described embodiment of the present disclosure, the generation of under-programmed memory cells may be prevented or avoided.

Figure 3:
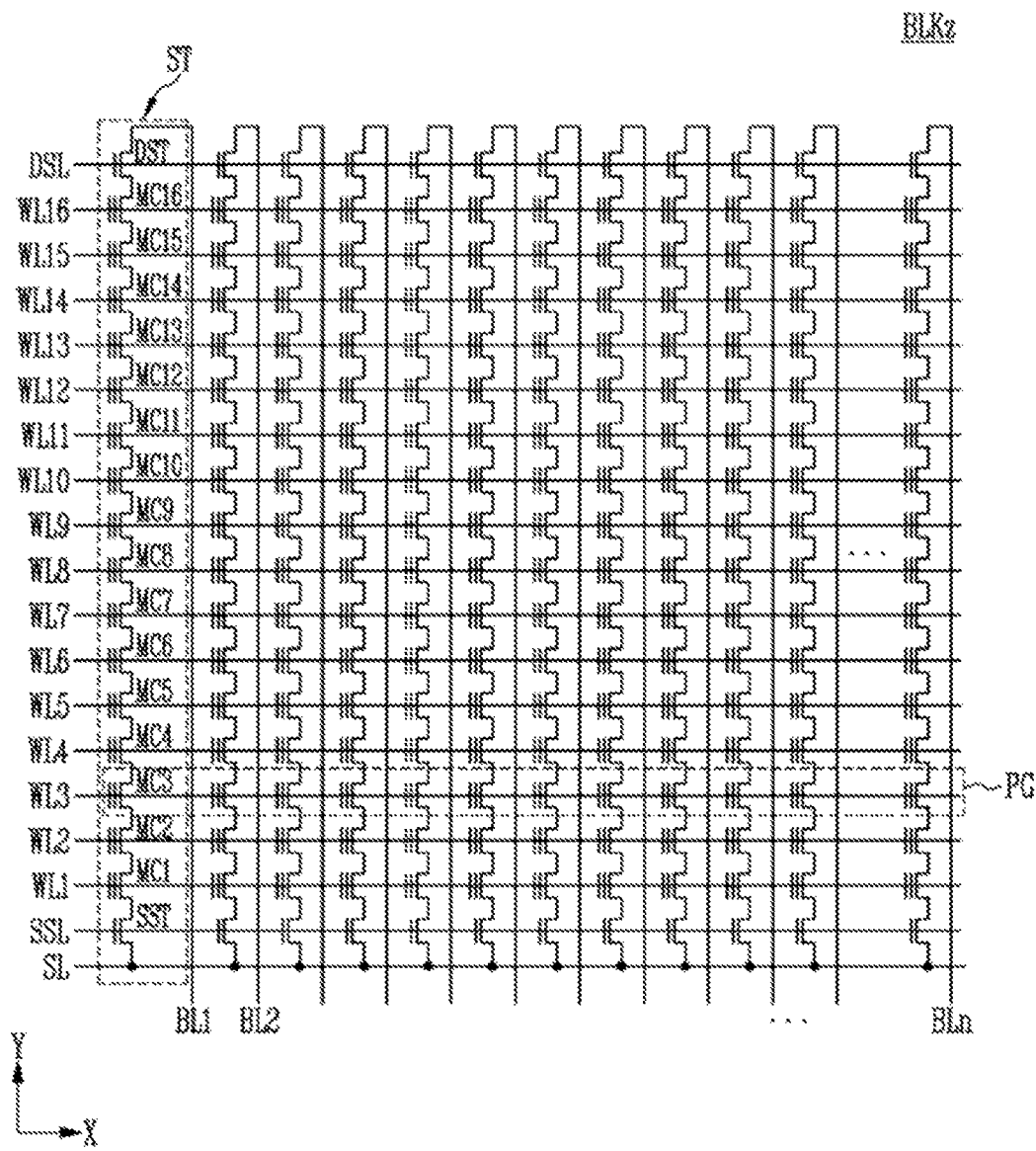
FIG. 3 is a diagram illustrating the structure of a memory block.

FIG. 3 is a diagram illustrating the structure of the memory block BLKz.

Referring to FIG. 3, the memory block BLKz may include a plurality of strings. Since the plurality of strings may have the same configuration, a string ST coupled to a first bit line BL1, among the plurality of strings, will be described as an example.

One end of the string ST may be coupled to the first bit line BL1 which is one of the bit lines BL1 to BLn. The other end of the string ST may be coupled to the source line SL. In other words, one source line SL may be commonly coupled to a plurality of strings, and one bit line may be coupled to one string.

The string ST may include a source select transistor SST, a plurality of memory cells MC1 to MCn, and a drain select transistor DST which are coupled in series to each other between the source line SL and the first bit line BL1. According to an embodiment, the string ST may include at least one source select transistor SST, at least one drain select transistor DST, and more memory cells than the memory cells MC1 to MCn as shown in FIG. 3.

Gates of the source select transistors SST may be coupled to the source select line SSL, and gates of the drain select transistors DST may be coupled to the drain select line DSL. A source of the source select transistor SST may be coupled to the source line SL and a drain of the drain select transistor DST may be coupled to the first bit line BL1.

Gates of the plurality of memory cells MC1 to MCn may be coupled to a plurality of word lines WL1 to WLn, respectively. The memory cells MC1 to MCn may be coupled in series between the source select transistor SST and the drain select transistor DST.

The memory block BLKz may include a plurality of pages. One page PG may be defined as a group of memory cells that are commonly coupled to the same word line. The page PG may be a group of memory cells corresponding to a unit for performing a program operation or a read operation. The memory block BLKz may be a group of memory cells corresponding to a unit for performing an erase operation.

The page PG may store page data. The page data may include data bits corresponding to the number of memory cells MC1 to MCn included in the page PG. For example, according to a single-level cell scheme in which one memory cell stores 1-bit data, each of the plurality of memory cells MC1 to MCn included in the page PG may store 1-bit data. In other words, one page PG may store one page data. In another example, according to a multiple-level cell scheme in which one memory cell stores 2-bit data, each of the plurality of memory cells MC1 to MCn included in the page PG may store 2-bit data. In other words, one page PG may store two page data. In a similar manner, according to a triple-level cell scheme in which one memory cell stores 3-bit data, one page PG may store three page data. According to a quad-level cell scheme in which one memory cell store 4-bit data, one page PG may store four page data. Hereinafter, for convenience of explanation, it may be assumed that a data storage scheme corresponds to a multi-level cell scheme.

FIGS. 4A to 4D are diagrams illustrating a distribution of threshold voltages of memory cells.

FIG. 4A is a diagram illustrating threshold voltages of memory cells on which an erase operation is performed.

Referring to FIG. 4A, an erase state may refer to a zeroth program state PV0 among the plurality of program states. Each of the program states may have a predetermined voltage range. According to an embodiment, the plurality of program states may have voltage ranges which are differentiated based on verify levels VVRF1 to VVRF3. The erase state may have a voltage range having the smallest state among the plurality of program states. For example, the erase state may have a voltage range having a smaller level than the verify levels VVRF1 to VVRF3 of the verify voltage. Each of the plurality of program states may indicate a predetermined value of data.

FIG. 4A illustrates three verify voltages. However, this is merely an embodiment. The number of verify voltages or the number of program states may vary depending on a storage scheme of a memory cell, such as a single-level cell scheme, a multi-level cell scheme, and a triple-level cell scheme.

Figure 4B:
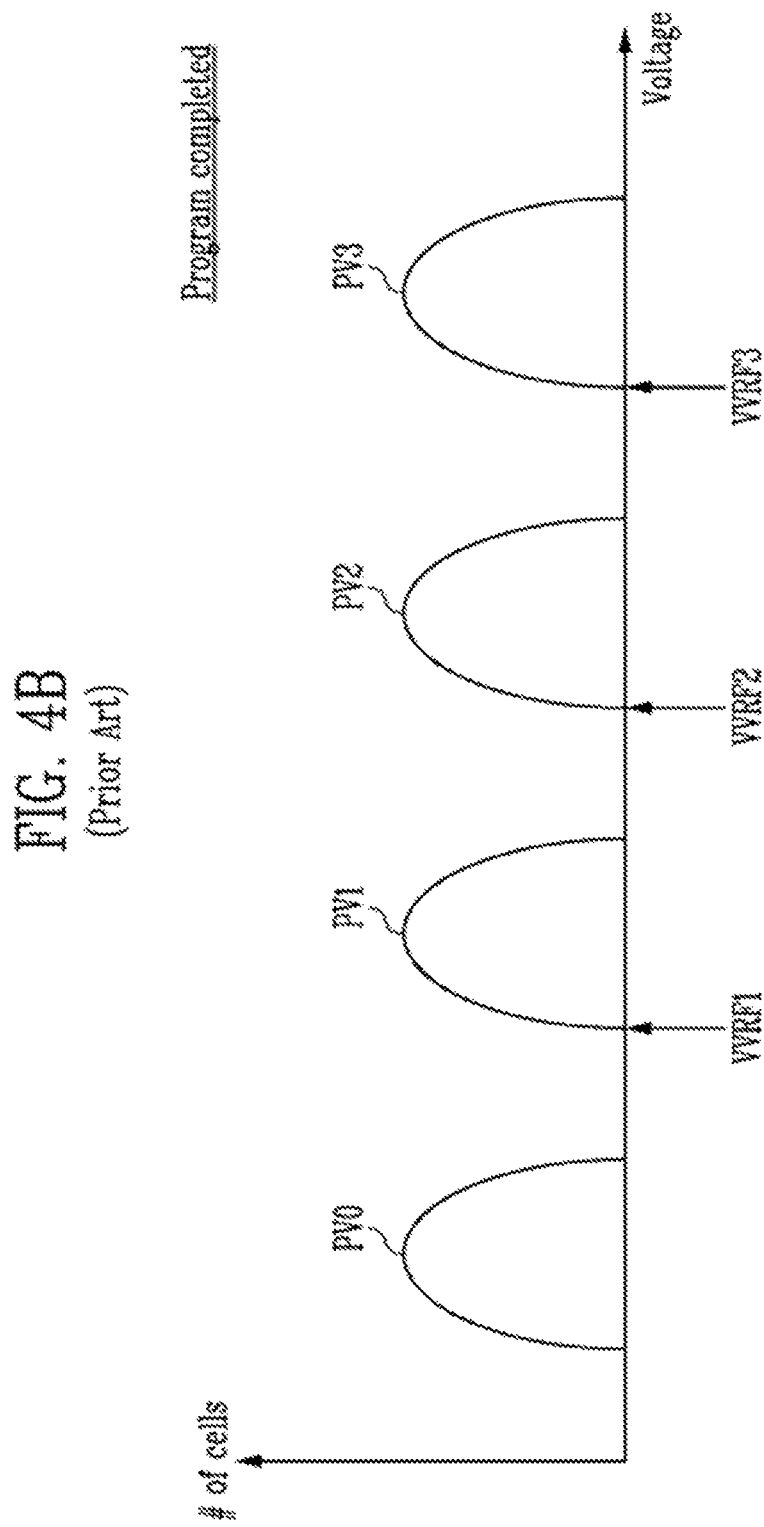
Figure 4C:
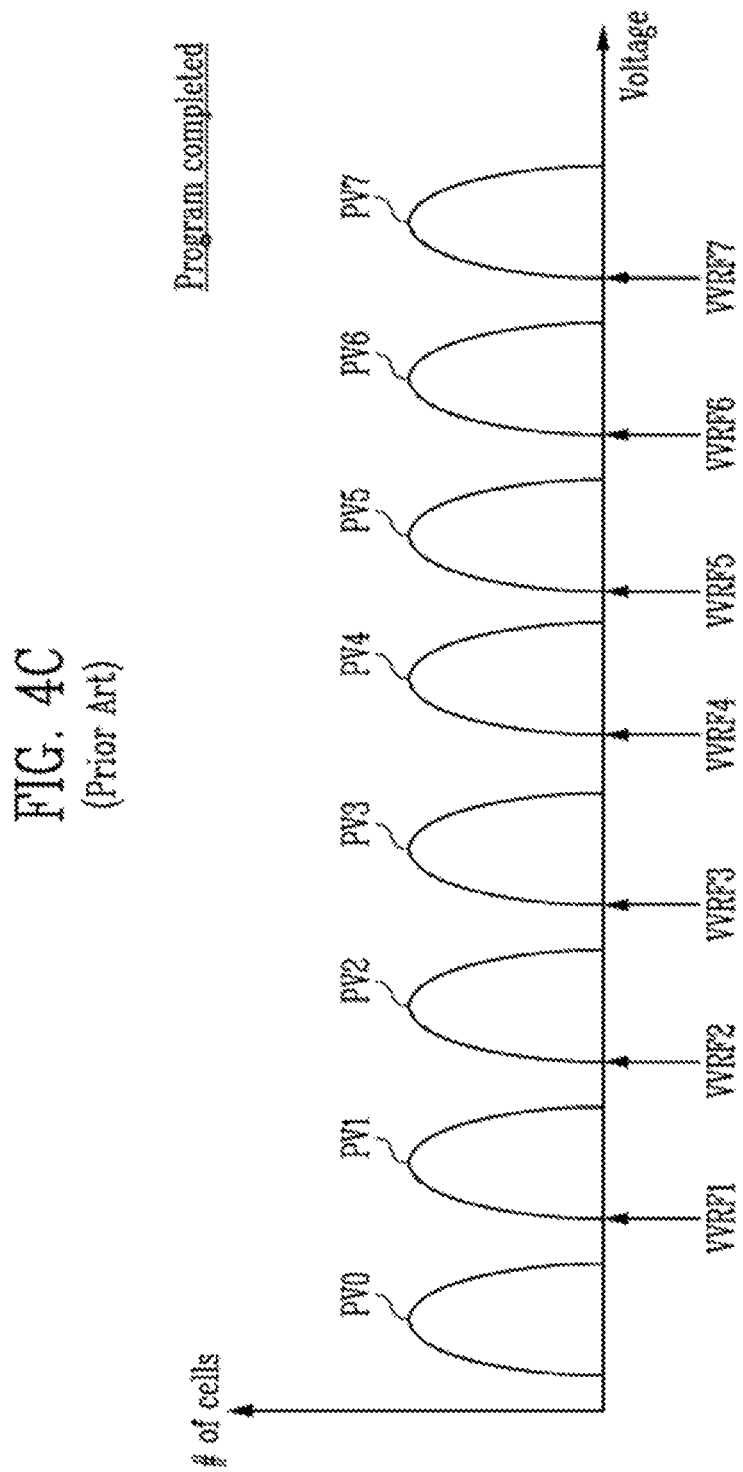

FIGS. 4B and 4C illustrate threshold voltages of memory cells on which a program operation is performed. Referring to FIG. 4B, a program operation may be performed according to a multi-level cell scheme. Referring to FIG. 4C, a program operation may be performed according to a triple-level cell scheme.

According to an embodiment, as for the multi-level cell scheme as shown in FIG. 4B, the plurality of program states may include the zeroth program state PV0 to a third program state PV3. The zeroth program state PV0 may be an erase state. The threshold voltages of the memory cells included in the selected page may be adjusted by a program operation so that the memory cells may have one program state among the zeroth to third program states PV0 to PV3 according to page data.

According to an embodiment, according to the triple-level cell scheme as shown in FIG. 4C, the plurality of program states may include the zeroth program state PV0 to a seventh program seventh PV7. The zeroth program state PV0 may be an erase state. The threshold voltages of the memory cells included in the selected page may be adjusted by a program operation so that the memory cells may have one program state among the zeroth to seventh program states PV0 to PV7 according to page data.

The verify voltage for verifying the plurality of program states may be adjusted into one level among the plurality of levels.

According to an embodiment, according to the multi-level cell scheme as shown in FIG. 4B, to verify the zeroth to third program states PV0 to PV3, the verify voltage may be adjusted into one level among the first to third verify levels VVRF1 to VVRF3. A program state of a memory cell may be determined using a verify voltage having a predetermined verify level. For example, a memory cell having a threshold voltage less than a verify level of the verify voltage applied to a word line coupled to the memory cell may be turned on, and a memory cell having a threshold voltage greater than or equal to the verify level may be turned off.

When the threshold voltage of the memory cell is less than the first verify level VVRF1, the memory cell may have the zeroth program state PV0. When the threshold voltage of the memory cell is greater than or equal to the first verify level VVRF1 and less than a second verify level VVRF2, the memory cell may have a first program state PV1. When the threshold voltage of the memory cell is greater than or equal to the second verify level VVRF2 and less than the third verify level VVRF3, the memory cell may have a second program state PV2. When the threshold voltage of the memory cell is greater than or equal to the third verify level VVRF3, the memory cell may have the third program state PV3. The values of the first to third verify levels VVRF1 to VVRF3 may be larger in a sequential order. In addition, the program states may be higher in order from the zeroth to third program states PV0 to PV3.

According to an embodiment, according to the triple-level cell scheme as shown in FIG. 4C, to verify the zeroth to seventh program states PV0 to PV7, the verify voltage may be adjusted into one level among the first to seventh verify levels VVRF1 to VVRF7. The program state of the memory cell may be determined using the verify voltage in a similar manner as described above with reference to FIG. 4B.

According to an embodiment, a program operation may be performed by an ISPP method in which a program voltage is gradually increased. More specifically, the program operation may include a plurality of program loops. Each of the plurality of program loops may include a program pulse operation and a verify operation. The memory device 100 may repeatedly perform next program loops until the program pulse operation is determined as a pass. As the program voltage is repeatedly applied to the selected word line, the threshold voltage of the memory cell coupled to the selected word line may be gradually increased. In other words, the program state of the memory cell may also be increased gradually. For example, the memory device 100 may repeat a program loop so that each of the memory cells having the zeroth program state PV0 may have one state among the zeroth program state PV0 to the third program state PV3 as shown in FIG. 4B.

FIG. 4D is a diagram illustrating threshold voltages of memory cells on which a program operation is performed according to a multi-level cell scheme. Referring to FIG. 4D, for example, it may be assumed that memory cells on which a program operation is performed using the first program state PV1 and the second program state PV2 as target program states are programmed, whereas memory cells on which a program operation is performed using the third program state PV3 as a target program state are under-programmed.

More specifically, when first memory cells 410 having threshold voltages less than the third verify level VVRF3 exist, the program pulse operation may be determined as a pass due to source line bouncing in which an excessive current is discharged to a common source line CSL. More particularly, this phenomenon may occur frequently in the case of a high program state among the program states. The program operation may be terminated with memory cells having an under-program state PV3' without performing the next program loop. The memory cells having the under-program state PV3' may include the first memory cells 410 having threshold voltages less than the third verify level VVRF3 and second memory cells 420 having threshold voltages greater than or equal to the third verify level VVRF3. The first memory cells 410 may be referred to simply as "slow cells" and the second memory cells 420 may be referred to simply as "fast cells."

A minimum level of the threshold voltages of the memory cells having the first program state PV1 may be greater than or equal to the first verify level VVRF1. A first read margin m1 may refer to a difference between the first verify level VVRF1 and a first read level VR1 of a read voltage. The first read level VR1 may be a predetermined level for reading data corresponding to the first program state PV1. The first read level VR1 may be smaller than the first verify level VVRF1.

A minimum level of the threshold voltages of the memory cells having the second program state PV2 may be greater than or equal to the second verify level VVRF2. A second read margin m2 may refer to a difference between the second verify level VVRF2 and a second read level VR2 of the read voltage. The second read level VR2 may be a predetermined level for reading data corresponding to the second program state PV2. The second read level VR2 may be smaller than the second verify level VVRF2.

A minimum level VU of the threshold voltages of the memory cells having the under-program state PV3' may be smaller than the third verify level VVRF3. A third read margin m3 may refer to a difference between the minimum level VU and a third read level VR3 of the read voltage. The third read level VR3 may be a predetermined level for reading data corresponding to the third program state PV3. The third read level VR3 may be smaller than the third verify level VVRF3.

The third read margin m3 for memory cells in which a distribution of threshold voltages thereof are abnormally controlled may have a lower value than the first read margin m1 and the second read margin m2 for memory cells in which a distribution of threshold voltages thereof is normally controlled. The third read margin m3 may be gradually decreased as the memory cells are deteriorated as time passes or the number of operations increases. The reliability of data may be more likely to deteriorate.

The above-described embodiment is based on the multi-level cell scheme. However, this description is also applicable to a triple-level cell scheme and a quad-level cell scheme.

In the present disclosure, a verify pass voltage which is applied to an unselected word line may be gradually increased during a verify operation to prevent an under-program state.

Figure 5:
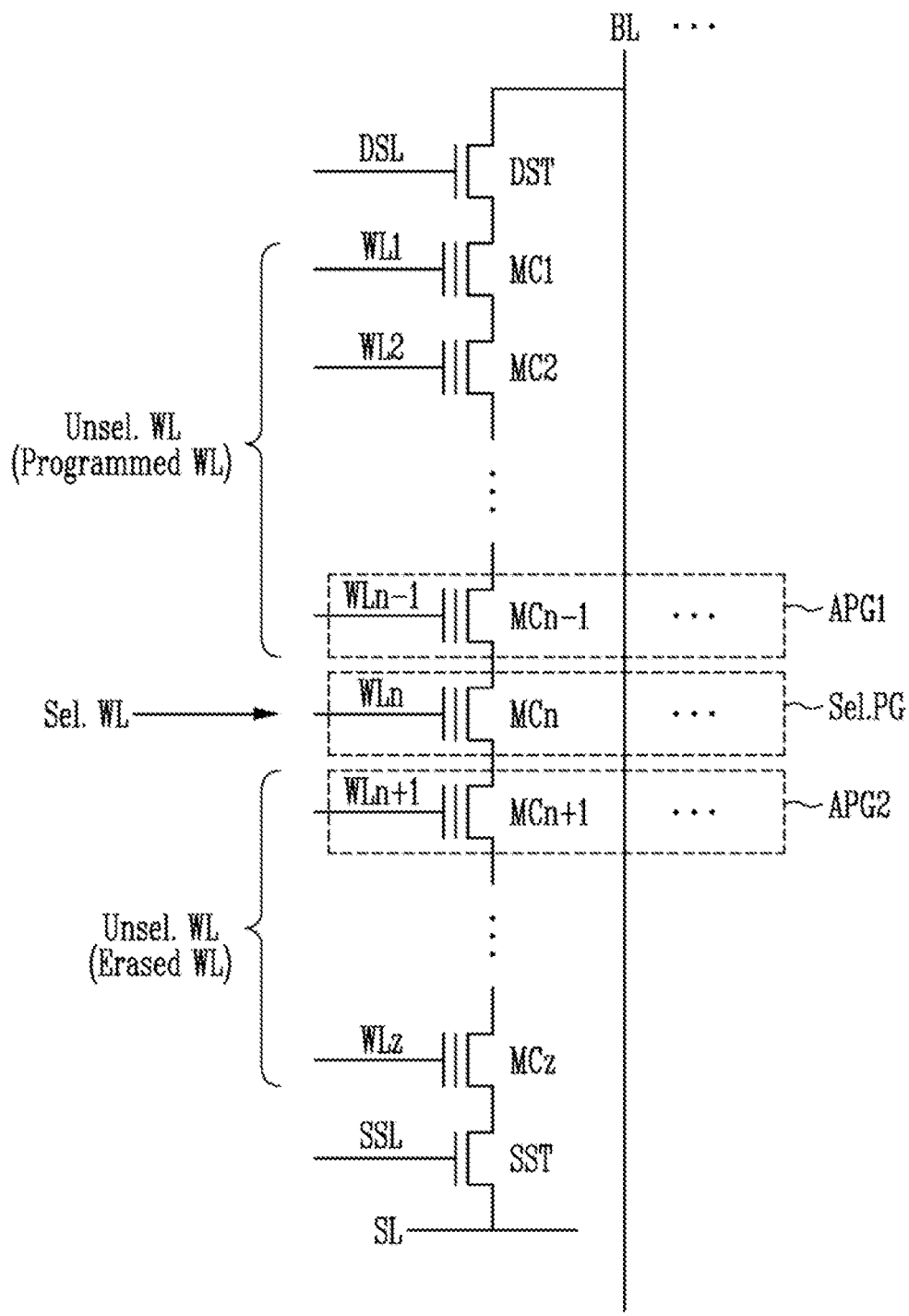
FIG. 5 is a diagram illustrating a selected word line and an unselected word line according to an embodiment of the present disclosure.

FIG. 5 is a diagram illustrating a selected word line and unselected word lines according to an embodiment of the present disclosure. FIG. 5 illustrates memory cells coupled to one bit line among memory cells included in a memory block, and does not illustrate memory cells coupled to other bit lines.

Referring to FIG. 5, a plurality of word lines WL1 to WLz may be coupled to memory cells MC1 to MCz, respectively, which are commonly coupled to one bit line BL. Each of the plurality of memory cells MC1 to MCz may be included in each page. Each of the pages may be coupled to the same word line and include memory cells which are coupled to another bit line.

A program operation may be sequentially performed on the memory cells MC1 to MCz which are coupled to the plurality of word lines WL1 to WLz, respectively. For example, referring to FIG. 5, a program operation may be sequentially performed on the first to (n−1)th memory cells MC1 to MCn−1 which are coupled to the first to (n−1)th word lines WL1 to WLn−1 among the memory cells MC1 to MCz included in the memory block. The nth to zth memory cells MCn to MCz coupled to the nth to zth word lines WLn to WLz, among the memory cells MC1 to MCz included in the memory block, may have a zeroth program state (i.e., an erase state).

Subsequently, the nth word line WLn may be selected by an address among the plurality of word lines WL1 to WLz. For example, a selected word line Sel.WL may be the nth word line WLn. A selected page Sel.PG coupled to the selected word line Sel.WL may include the nth memory cell MCn. Unselected word lines Unsel.WL may include the remaining word lines coupled to the memory block, except for the selected word line Sel.WL, among the plurality of word lines WL1 to WLz. For example, the unselected word lines Unsel.WL may include first to (n−1)th word lines WL1 to WLn−1 and (n+1)th to zth word lines WLn+1 to WLz.

When the memory device 100 receives a program command and an address, the memory device 100 may perform a program loop which includes a program pulse operation and a verify operation. It may be assumed that the address indicates the selected word line Sel.WL or the selected page Sel.PG.

More specifically, the memory device 100 may perform a program pulse operation of applying a program voltage to the selected word line Sel.WL and applying a program pass voltage to the unselected word lines Unsel.WL. Subsequently, the memory device 100 may perform a verify operation of applying a verify voltage to the selected word line Sel.WL and applying a verify pass voltage to the unselected word lines Unsel.WL.

When the program pulse operation fails by the verify operation, the memory device 100 may perform the next program loop including a program pulse operation and a verify operation.

More specifically, the memory device 100 may increase the level of the program voltage. The memory device 100 may perform a program pulse operation of applying a program voltage to the selected word line Sel.WL and applying a program pass voltage to the unselected word lines Unsel.WL. In other words, the program voltage with an increased level may be applied to the selected word line Sel.WL.

In addition, the memory device 100 may increase the level of the verify pass voltage which is applied to at least one unselected word line among the unselected word lines Unsel.WL when the threshold voltages of the memory cells included in the selected page Sel.PG coupled to the selected word line Sel.WL are greater than or equal to a reference level. For example, the reference level may be one predetermined verify level among verify levels of a verify voltage for verifying a plurality of program states. The memory device 100 may perform a verify operation of applying a verify voltage to the selected word line Sel.WL and applying a verify pass voltage to the unselected word lines Unsel.WL. In other words, during a verify operation, a verify pass voltage having the same level as before may be applied to the unselected word lines Unsel.WL, or a verify pass voltage having a level which is increased more than before may be applied to at least some of the unselected word lines Unsel.WL.

In association with the verify operation, the verify pass voltage having the increased level may be applied to at least one of the unselected word lines Unsel.WL.

According to an embodiment, the at least one unselected word line, to which the verification pass voltage of the increased level is applied, may include at least one adjacent word line located within a predetermined distance based on a position of the selected word line Sel.WL from among the plurality of word lines WL1 to WLz coupled to the memory block. The predetermined distance may be a value obtained by multiplying a predetermined number by an offset value. The offset value may be a distance between two word lines adjacent to each other. The predetermined number may be a natural number of 1 or more. For example, when the predetermined number is 1, the at least one unselected word line may include the (n−1)th word line WLn−1 and the (n+1)th word line WLn+1 which are the most adjacent to the nth word line WLn corresponding to the selected word line Sel.WL. More specifically, when the predetermined number is 1, the memory device 100 may determine a first adjacent page APG1 and a second adjacent page APG2, which are the most adjacent to the selected page Sel.PG coupled to the nth word line WLn which is the selected word line Sel.WL, and may determine the (n−1)th word line WLn−1 coupled to the first adjacent page APG1 and the (n+1)th word line WLn+1 coupled to the second adjacent page APG2 as the at least one unselected word line.

The memory device 100 may apply the verify voltage to the selected word line Sel.WL during the verify operation. While the memory device 100 applies the verify voltage to the selected word line Sel.WL, the memory device 100 may apply the verify pass voltage with an increased level to the (n−1)th word line WLn−1 and the (n+1)th word WLn+1, among the unselected word lines Unsel.WL, and may apply the verify pass voltage with the maintained level.

According to an embodiment, the at least one unselected word line, to which the verification pass voltage of the increased level is applied, may be the remaining word lines, except for the nth word line WLn corresponding to the selected word line Sel.WL, among the plurality of word lines WL1 to WLz coupled to the memory block. In other words, the at least one unselected word line may be the entirety of the unselected word lines Unsel.WL. The memory device 100 may increase the level of the verify pass voltage applied to the unselected word lines Unsel.WL. The memory device 100 may apply the verify pass voltage with the increased level to the unselected word lines Unsel.WL during the verify operation while the memory device 100 applies the verify voltage to the selected word line Sel.WL.

According to an embodiment, when the threshold voltages of the memory cells are greater than or equal to the reference level, the memory device 100 increase the level of the verify pass voltage applied to the unselected word lines Unsel.WL by a varying increment.

More specifically, the memory device 100 may increase the level of the verify pass voltage applied to the word line coupled to the program-completed page, among the unselected word lines Unsel.WL, by a first increase. In addition, the memory device 100 may increase the level of the verify pass voltage applied to the word line coupled to the erased page, among the unselected word lines Unsel.WL, by a second increase. The erased page may include memory cells having the zeroth program state PV0.

For example, referring to FIG. 5, the level of the verify pass voltage applied to the first to (n−1)th word lines WL1 to WLn−1 may be increased by the first increase, and the level of the verify pass voltage applied to the (n+1)th to zth word lines WLn+1 to WLz may be increased by the second increase. The second increase may have a smaller value than the first increase. However, this is merely an example. The second increase may have a greater value than the first increase.

The verify pass voltage whose level is increased by the first increase may be applied to some or all of the first to (n−1)th word lines WL1 to WLn−1. In addition, the verify pass voltage whose level is increased by the second increase may be applied to some or all of the (n+1)th to zth word lines WLn+1 to WLz.

More specifically, for example, the memory device 100 may apply the verify pass voltage having the level increased by the first increase to the (n−1)th word line WLn−1 coupled to the first adjacent page APG1 which is the most adjacent to the selected page Sel.PG coupled to the nth word line WLn, which is the selected word line Sel.WL, among the program-completed pages. The memory device 100 may apply the verify pass voltage whose level is maintained to the remaining pages, except for the first adjacent page APG1, among the program-completed pages.

In parallel thereto, the memory device 100 may apply the verify pass voltage having the level increased by the second increase to the (n+1)th word line WLn+1 coupled to the second adjacent page APG2 which is the most adjacent to the selected page Sel.PG coupled to the nth word line WLn, which is the selected word line Sel.WL, among the erased pages. The memory device 100 may apply the verify pass voltage with the maintained level to the remaining pages, except for the second adjacent page APG2, among the erased pages.

The memory device 100 may terminate the program operation when the program pulse operation passes according to the verify operation.

The above-described embodiments are merely examples. The number of word lines included in the at least one unselected word line, to which the verification pass voltage of the increased level is applied, and the position relationship therebetween may vary.

Figure 6:
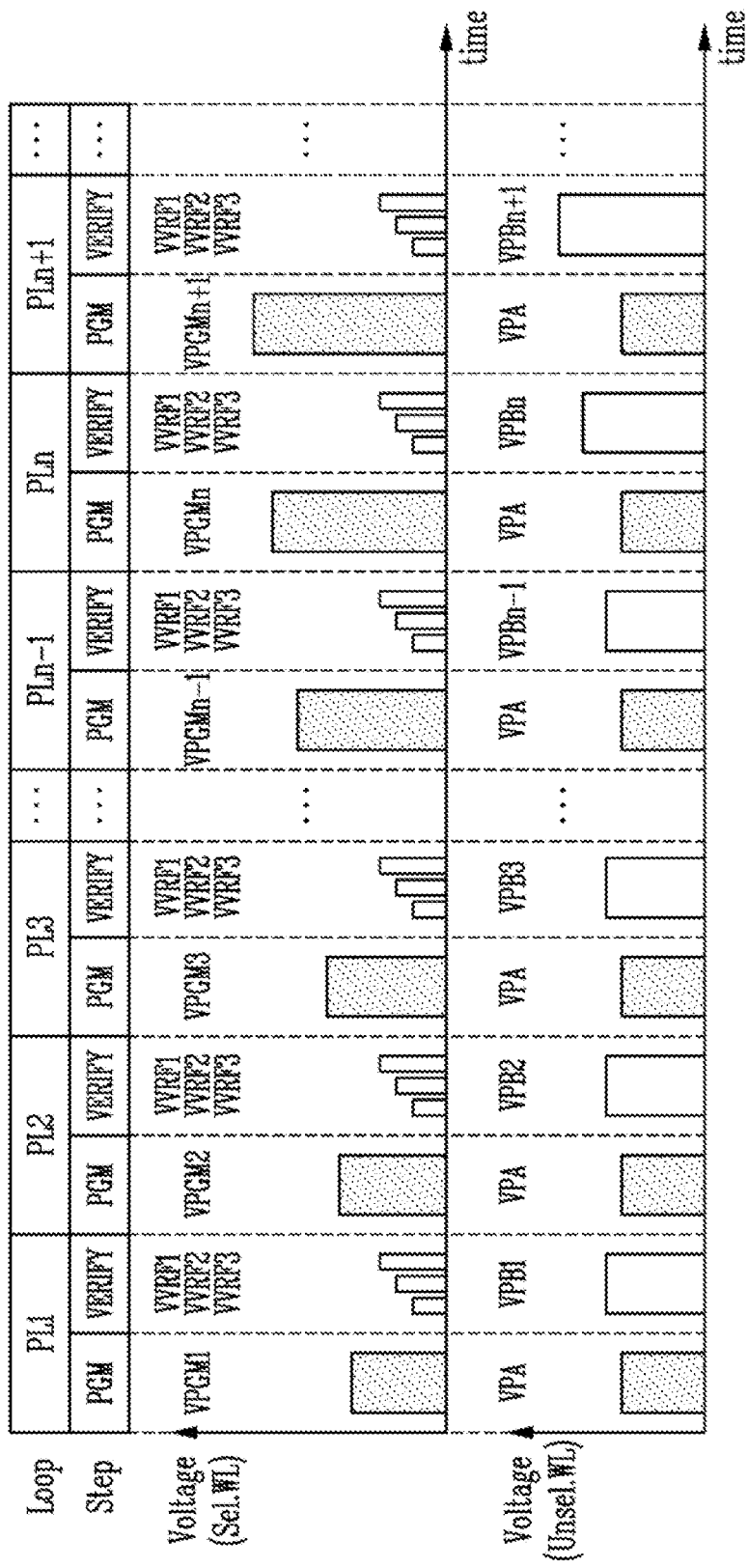
FIG. 6 is a diagram illustrating a program loop according to an embodiment of the present disclosure.

FIG. 6 is a diagram illustrating a program loop according to an embodiment of the present disclosure.

Referring to FIG. 6, the memory device 100 may sequentially perform a plurality of program loops PL1, PL2, PL3, . . . , PLn−1, PLn, PLn+1, . . . according to a predetermined order until a selected memory cell reaches a target state among program states. The target state may be determined according to data to store, among the program states.

Each of the plurality of program loops PL1, PL2, PL3, . . . , PLn−1, PLn, PLn+1, . . . may include a program pulse operation PGM of applying a program voltage so that the memory cell reaches the target state and a verify operation VERIFY of applying a verify voltage to determine whether the memory cell reaches the target state. The target state may be determined according to data to store, among the plurality of program states.

For example, a memory cell having the first program state PV1 as the target state may be verified by a verify voltage having the first verify level VVRF1, a memory cell having the second program state PV2 as the target state may be verified by a verify voltage having the second verify level VVRF2, and a memory cell having the third program state PV3 as the target state may be verified by the verify voltage having the third verify level VVRF3. However, this is merely an example, and a plurality of verify voltages may be applied for more accurate verification.

According to an embodiment, when the target state is the third program state PV3, the memory device 100 may sequentially perform the plurality of program loops PL1, PL2, PL3, . . . , PLn−1, PLn, PLn+1, . . . until the selected memory cell reaches the target state, i.e., the third program state PV3. In other words, the memory device 100 may sequentially perform the plurality of program loops PL1, PL2, PL3, . . . , PLn−1, PLn, PLn+1, . . . until the threshold voltage of the selected memory cell is greater than or equal to the third verify level VVRF3 corresponding to the target level. The target level may correspond to the target state. Hereinafter, a description will be made on the assumption that the second verify level VVRF2, among the plurality of verify levels VVRF1, VVRF2, and VVRF3, is set as a reference level.

More specifically, the memory device 100 may sequentially perform the program pulse operation PGM and the verify operation VERIFY included in the first program loop PL1.

To increase the threshold voltage of the selected memory cell, the program pulse operation PGM of the first program loop PL1 may apply the program voltage to the selected word line Sel.WL coupled to the selected memory cell and may apply a program pass voltage to the unselected word lines Unsel.WL. The program voltage may have a first program level VPGM1. The program pass voltage may have a program pass level VPA.

The verify operation VERIFY of the first program loop PL1 may apply at least one verify voltage to the selected word line Sel.WL coupled to the selected memory cell and may apply the verify pass voltage to the unselected word lines Unsel.WL. At least one verify voltage may include at least one of the voltage having the first verify level VVRF1, the voltage having the second verify level VVRF2, and the voltage having the third verify level VVRF3. The verify voltage may be determined by a program state. The verify pass voltage may have a first verify pass level VPB1.

When the threshold voltage of the memory cell is greater than or equal to the third verify level VVRF3 of the verify voltage, the memory device 100 may determine that the program pulse operation PGM has passed. When the threshold voltage of the memory cell is less than the third verify level VVRF3 of the verify voltage, the memory device 100 may determine that the program pulse operation PGM has failed.

In addition, until it is determined that the program pulse operation PGM has passed according to the verify operation VERIFY, the memory device 100 may repeatedly perform the next program loop such as the second program loop PL2, the third program loop PL3, . . . .

For example, when it is determined that the program pulse operation PGM has failed according to the verify operation VERIFY, the memory device 100 may sequentially perform the program pulse operation PGM and the verify operation VERIFY included in the second program loop PL2.

According to an embodiment, whenever the program loop is repeated, the memory device 100 may gradually increase the level of the program voltage to, for example, the first program level VPGM1, a second program level VPGM2, a third program level VPGM3, . . . , an (n−1)th program level VPGMn−1, an nth program level VPGMn, an (n+1)th program level VPGMn+1.

According to an embodiment, whenever the program loop is repeated, the memory device 100 may maintain the level of the program pass voltage at, for example, the program pass level VPA.

According to an embodiment, when the next program loop is performed, the memory device 100 may use at least one of the voltage having the first verify level VVRF1, the voltage having the second verify level VVRF2, and the voltage having the third verify level VVRF3 for a verify operation.

For example, when it is determined that the memory cell has the zeroth program state PV0 through the verify operation, the verify voltage having the first verify level VVRF1 may be applied to the selected word line Sel.WL during a verify operation of the next program loop. Before or after applying the verify voltage having the first verify level VVRF1, at least one of the verify voltage having the second verify level VVRF2 and the verify voltage having the third verify level VVRF3 may be additionally applied to the selected word line Sel.WL.

In another example, when it is determined that the memory cell has the first program state PV1 through the verify operation, the verify voltage having the second verify level VVRF2 may be applied to the selected word line Sel.WL during a verify operation of the next program loop. Before or after the verify voltage having the second verify level VVRF2 is applied, at least one of the verify voltage having the first verify level VVRF1 and the verify voltage having the third verify level VVRF3 may be additionally applied to the selected word line Sel.WL.

In another example, when it is determined that the memory cell has the second program state PV2 through the verify operation, the verify voltage having the third verify level VVRF3 may be applied to the selected word line Sel.WL during a verify operation of the next program loop. Before or after the verify voltage having the third verify level VVRF3 is applied, at least one of the verify voltage having the first verify level VVRF1 and the verify voltage having the second verify level VVRF2 may be additionally applied to the selected word line Sel.WL.

According to an embodiment, whenever the next program loop is performed when the threshold voltage of the selected memory cell is greater than or equal to the reference level, the memory device 100 may gradually increase the level of the verify pass voltage to, for example, an (n+1)th verify pass level VPBn+1, an nth verify pass level VPBn, an (n+1)th verify pass level VPBn+1, . . . . In this manner, the level of the threshold voltage of the memory cell identified as a greater level than the actual level caused by the reduction in sensing current flowing in the string due to source line bouncing may be compensated. For example, when the level of the verify pass voltage applied to the unselected word lines Unsel.WL is increased, the sensing current may be increased. As a result, the level of the threshold voltage of the memory cell coupled to the selected word line Sel.WL may be identified as a smaller value. The verify pass voltage with the increased level may be applied to some or all of the unselected word lines Unsel.WL.

According to an embodiment, when the next program loop is performed as the threshold voltage of the selected memory cell is less than the reference level, the memory device 100 may maintain the level of the verify pass voltage at, for example, the first verify pass level VPB1, a second verify pass level VPB2, a third verify pass level VPB3, . . . , and an (n−1)th verify pass level VPBn−1. The first verify pass level VPB1, the second verify pass level VPB2, the third verify pass level VPB3, . . . , and the (n−1)th verify pass level VPBn−1 may be the same level. Thus, the level of the verify pass voltage may be selectively applied according to the threshold voltage or the program state of the memory cell.

Figure 7:
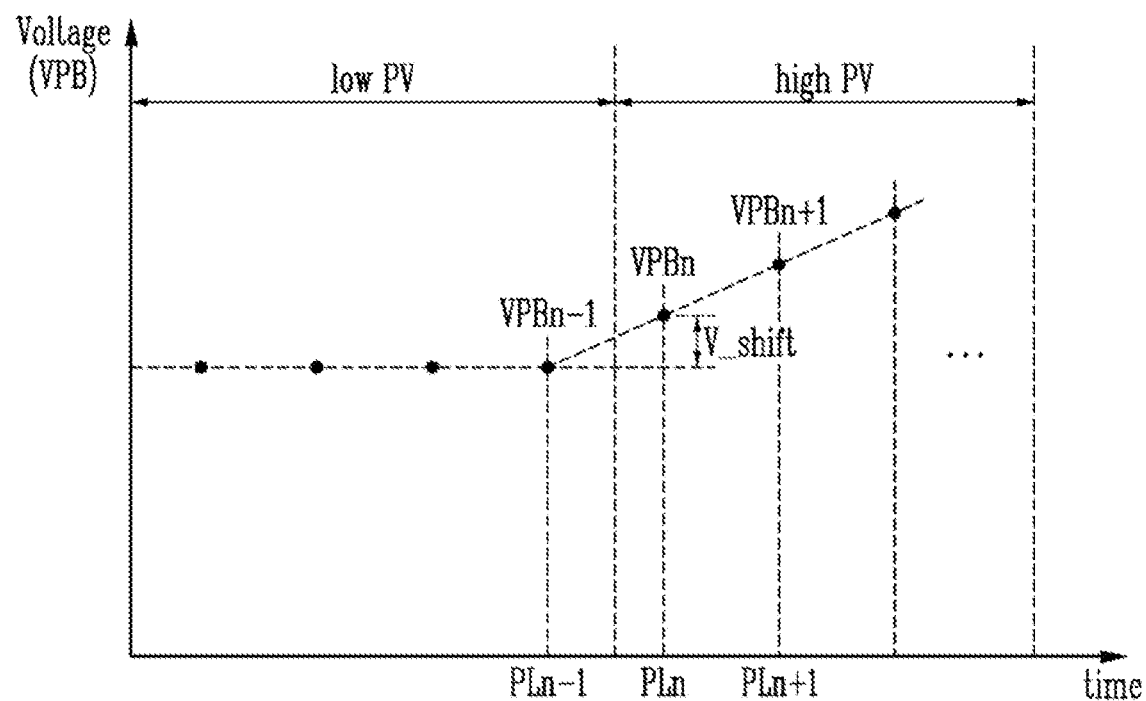
FIG. 7 is a diagram illustrating the structure of a verify pass voltage according to an embodiment of the present disclosure.

FIG. 7 is a diagram illustrating a change in verify pass voltage according to an embodiment of the present disclosure. FIG. 7 is graph illustrating a verify pass voltage over time, or according to a program loop.

Referring to FIG. 7, the memory device 100 may sequentially perform a plurality of program loops until a program operation or a program pulse operation passes. Hereinafter, it may be assumed that threshold voltages of memory cells are sensed as the reference level or greater according to a verify operation of an (n−1)th program loop PLn−1.

In program loops prior to the (n−1)th program loop PLn−1, the memory device 100 may determine that the threshold voltages of the memory cells coupled to the selected word line are less than the reference level and less than the target level according to a verify operation. In the (n−1)th program loop PLn−1, the memory device 100 may determine that the threshold voltages of the memory cells coupled to the selected word line are greater than or equal to the reference level and less than the target level according to a verify operation.

The memory device 100 may perform the nth program loop PLn after the (n−1)th program loop PLn−1. More specifically, the memory device 100 may increase the level of the verify pass voltage of the verify operation included in the nth program loop PLn by a voltage increase V_shift. The memory device 100 may linearly increase the level of the verify pass voltage as the program loop is performed. In other words, the memory device 100 may increase the level of the verify pass voltage according to a fixed value of the voltage increase V_shift. On the other hand, the memory device 100 may non-linearly increase the level of the verify pass voltage as the program loop is performed. In other words, the memory device 100 may increase the level of the verify pass voltage according to a varied value of the voltage increase V_shift. The value of the voltage increase V_shift may be set beforehand and stored in the memory device 100.

According to an embodiment, the memory device 100 may maintain the level of the verify pass voltage in a program loop section in which the threshold voltage of the memory cell is less than the reference level. In another embodiment, the memory device 100 may increase the level of the verify pass voltage by an increase lower than the voltage increase V_shift as the program loop is performed in the program loop section in which the threshold voltage of the memory cell less than the reference level.

FIG. 8A is a diagram illustrating conditions under which a verify pass voltage is changed according to an embodiment of the present disclosure.

Referring to FIG. 8A, according to an embodiment of the present disclosure, a level of a verify pass voltage may be determined based on a result of comparing threshold voltages of memory cells and a reference level or a result of comparing a program state of the memory cells with a reference program state. The reference level or the reference program state may be determined in advance according to a data storage scheme. For example, the reference program state may be set beforehand, considering the frequency of occurrence of under programming per program state of the memory cell, by performing a program operation with the level of the verify pass voltage maintained at a constant value.

According to an embodiment, when the data storage scheme is a multi-level cell (MLC) scheme, the reference program state may be set to the second program state PV2 among the plurality of program states PV0 to PV3. The reference level may be a verify level for verifying the second program state PV2, which is the reference program state, among the verify levels of the verify voltage.

According to an embodiment, when the data storage scheme is a triple-level cell (TLC) scheme, the reference program state may be set to a fifth program state PV5 among the plurality of program states PV0 to PV7. The reference level may be a verify level for verifying the fifth program state PV5, which is the reference program state, among the verify levels of the verify voltage.

However, the example of the above-described reference level or reference program state is merely an embodiment, and various modifications may be made.

Figure 8B:
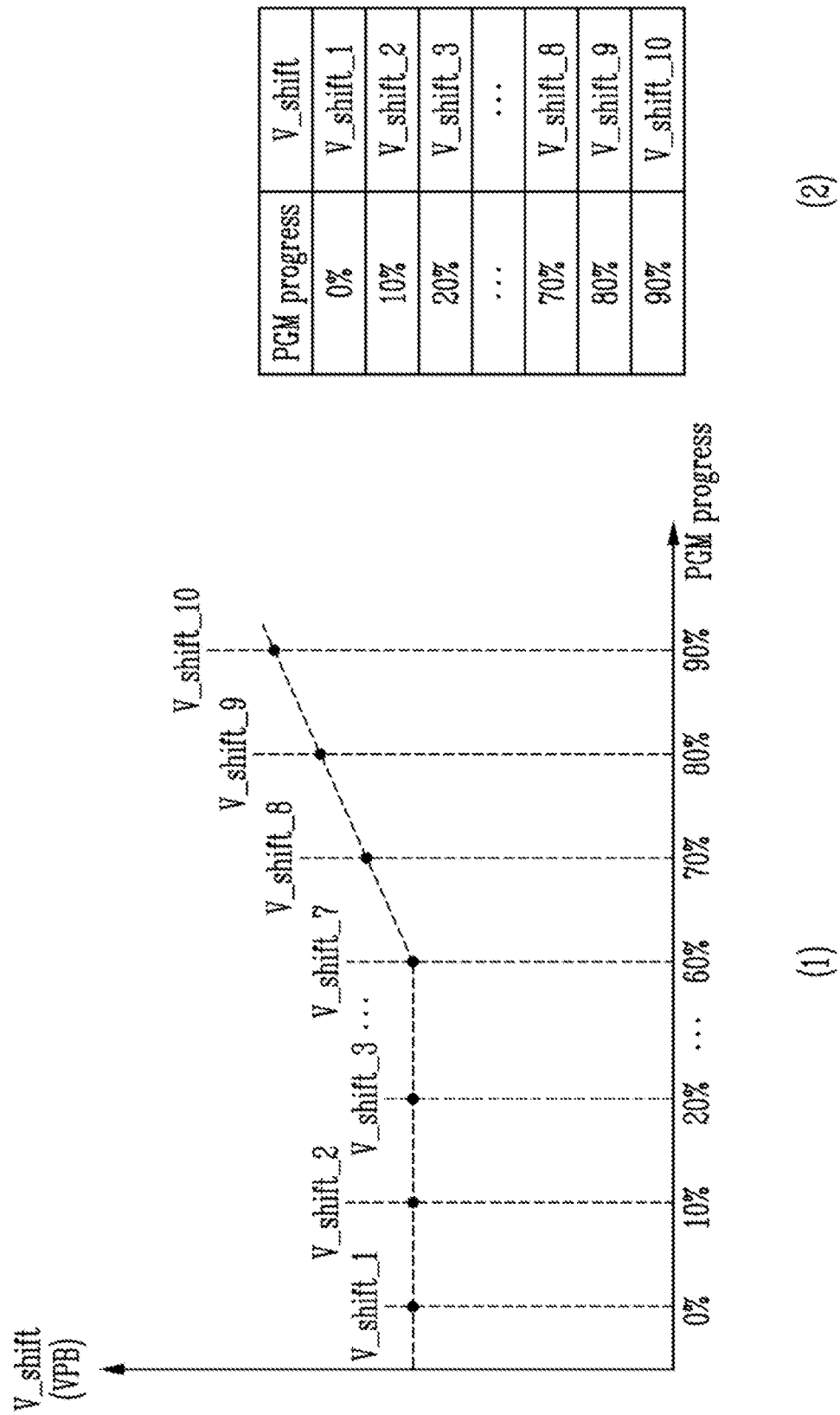
FIG. 8B is a diagram illustrating variations in increase of a verify pass voltage according to an embodiment of the present disclosure.

FIG. 8B is a diagram illustrating a change in increase of a verify pass voltage according to an embodiment of the present disclosure.

Referring to (1) and (2) of FIG. 8B, the memory device 100 may adjust the value of the voltage increase V_shift based on the number of program-completed pages among the plurality of pages included in the memory block. The number of program-completed pages, among the plurality of pages included in the memory block, may indicate the progress of programming of the memory block. The voltage increase V_shift may indicate a degree to which the level of the verify pass voltage is increased. As the value of the voltage increase V_shift is increased, the difference between the level of the verify pass voltage in the previous program loop and the level of the verify pass voltage in the next program loop may be increased.

When the threshold voltages of the memory cells coupled to the selected word line are greater than or equal to the reference level, the memory device 100 may increase the level of the verify pass voltage applied to the selected word line by the value of the voltage increase V_shift. The sensing current flowing in the string may vary depending on the progress of the programming of the memory block. In other words, when the degree to which the memory block is programmed is greater than a predetermined degree, an under-program phenomenon may be effectively prevented by increasing the level of the verify pass voltage.

According to an embodiment, when a ratio of the number of program-completed pages and the number of pages is less than a reference value, the memory device 100 may maintain the value of the voltage increase V_shift. For example, the reference value may be a predetermined value such as 60% as shown in (1) and (2) of FIG. 8B. However, this is merely an example. The reference value may be set to be value which is different from 60%, or the voltage increase V_shift may be linearly or non-linearly increased even when the ratio is less than the reference value.

According to an embodiment, when the ratio of the number of program-completed pages and the number of pages is greater than or equal to the reference value, the memory device 100 may adjust the value of the voltage increase V_shift according to the difference between the ratio and the reference value. For example, when the ratio is more than 60% as shown in (1) and (2) of FIG. 8B, the value of the voltage increase V_shift may be adjusted so as to be in proportional to the difference between the ratio and the reference value. However, this is merely an example. The reference value may be set to a different value other than from 60%, or the voltage increase V_shift may be non-linearly increased.

More specifically, for example, it may be assumed that when a memory block includes 100 pages, i.e., first to 100th pages, ten pages, i.e., the first to 10th pages, are program-completed, and a program operation is performed on an 11th page corresponding to a selected page.

A second value V_shift_2 corresponding to 10% which is the ratio of the number of program-completed pages and the number of pages may be applied as the value of the voltage increase V_shift. The memory device 100 may repeat the program loop until threshold voltages of memory cells included in the 11th page reach the target level or more. When the threshold voltages of the memory cells included in the 11th page are greater than or equal to the reference level, the memory device 100 may increase the level of the verify pass voltage applied to the selected word line coupled to the 11th page by the second value V_shift_2 of the voltage increase V_shift whenever the memory device 100 performs the next program loop.

In another example, it may be assumed that when a memory block includes 100 pages, i.e., first to 100th pages, 80 pages, i.e., the first to 80th pages, are program-completed, and a program operation is performed on an 81st page corresponding to a selected page.

The memory device 100 may use a ninth value V_shift_9 corresponding to 80%, which is the ratio of the number of program-completed pages and the number of pages, for the value of the voltage increase V_shift. The memory device 100 may repeat the program loop until threshold voltages of memory cells included in the 81th page reach the target level or more. When the threshold voltages of the memory cells included in the 81th page are greater than or equal to the reference level, the memory device 100 may increase the level of the verify pass voltage applied to the selected word line coupled to the 81th page by the ninth value V_shift_9 of the voltage increase V_shift whenever the memory device 100 performs the next program loop.

According to an embodiment of the present disclosure, the memory device 100 that prevents the generation of under-programmed memory cells may be provided. In addition, the reliability of a verify operation for verifying a program pulse operation will be improved.

Figure 9:
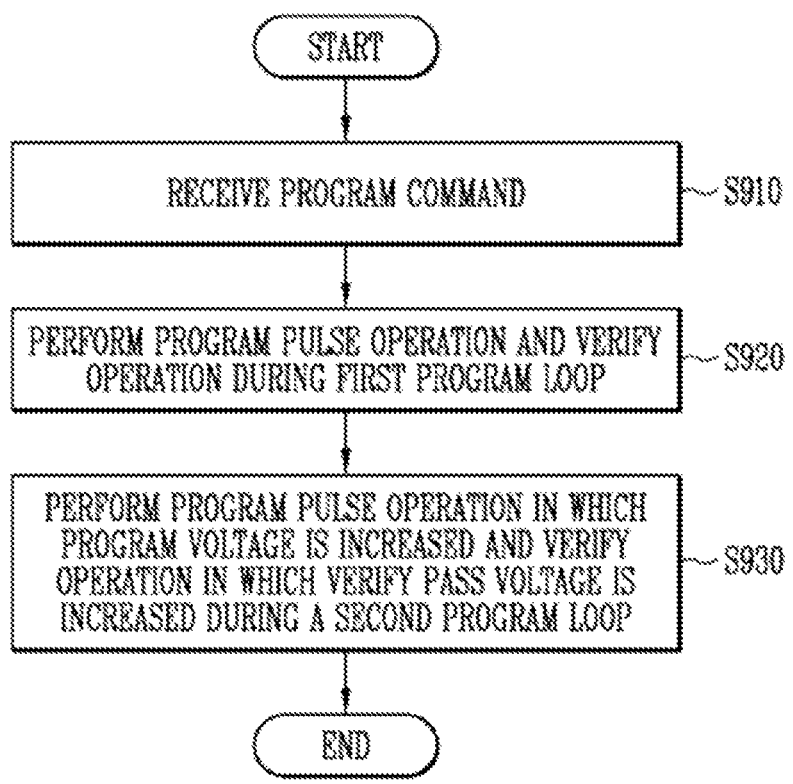
FIG. 9 is a diagram illustrating operations of a memory device according to an embodiment of the present disclosure.

FIG. 9 is a diagram illustrating operations of the memory device 100 according to an embodiment of the present disclosure.

Referring to FIG. 9, a method of operating the memory device 100 may include receiving a program command at step S910, sequentially performing a program pulse operation and a verify operation in a first program loop at step S920, and performing a program pulse operation with an increased program voltage and a verify operation with an increased verify pass voltage during a second program loop at step S930.

More specifically, the memory device 100 may receive a program command at step S910. The memory device 100 may receive an address along with the program command. In addition, the memory device 100 may receive data to be stored in the memory block.

According to an embodiment, the method of operating the memory device 100 may further include storing information about levels of a program voltage, a verify voltage, and a verify pass voltage for each of the plurality of loops including first and second program loops.

In addition, the memory device 100 may sequentially perform a program pulse operation and a verify operation in the first program loop at step S920. During the program pulse operation, the program voltage may be applied to a selected word line determined by the address among the plurality of word lines coupled to the plurality of pages included in the memory block. During the verify operation, the verify voltage corresponding to the program voltage may be applied to the selected word line, and the verify pass voltage may be applied to unselected word lines.

According to an embodiment, the method of operating the memory device 100 may further include applying the program pass voltage to the unselected word lines during the program pulse operation.

According to an embodiment, the method of operating the memory device 100 may further include sensing the threshold voltages of the memory cells included in the page coupled to the selected word line according to the verify operation during the first program loop.

In addition, when the threshold voltages of the memory cells included in the page coupled to the selected word line are greater than or equal to the reference level and less than the target level greater than or equal to the reference level, the memory device 100 may sequentially perform a program pulse operation with an increased level of the program voltage and a verify operation with an increased verify pass voltage in the second program loop at step S930.

According to an embodiment, the method of operating the memory device 100 may further include sequentially performing the program pulse operation with the increased level of the program voltage and the verify operation with the maintained level of the verify pass voltage during the second program loop.

According to an embodiment, the method of operating the memory device 100 may further include adjusting an increase of the verify pass voltage on the basis of the number of program-completed pages among the plurality of pages included in the memory block.

Adjusting the increase of the verify pass voltage may include maintaining the increase at a constant value when the ratio of the number of program-completed pages and the number of pages is less than the reference value, and adjusting the increase in proportion to the difference between the ratio and the reference value when the ratio is greater than or equal to the reference value.

According to an embodiment, the method of operating the memory device 100 may further include sequentially performing a program pulse operation with the increased level of the program voltage and a verify operation with the increased level of the verify pass voltage during a third program loop when the threshold voltages of the memory cells included in the page coupled to the selected word line are greater than or equal to the reference level and less than the target level.

According to an embodiment, the method of operating the memory device 100 may further include outputting a pass signal of the program operation corresponding to the program command when the threshold voltages of the memory cells included in the page coupled to the selected word line are greater than or equal to the target level. In other words, the program operation may be terminated.

Figure 10:
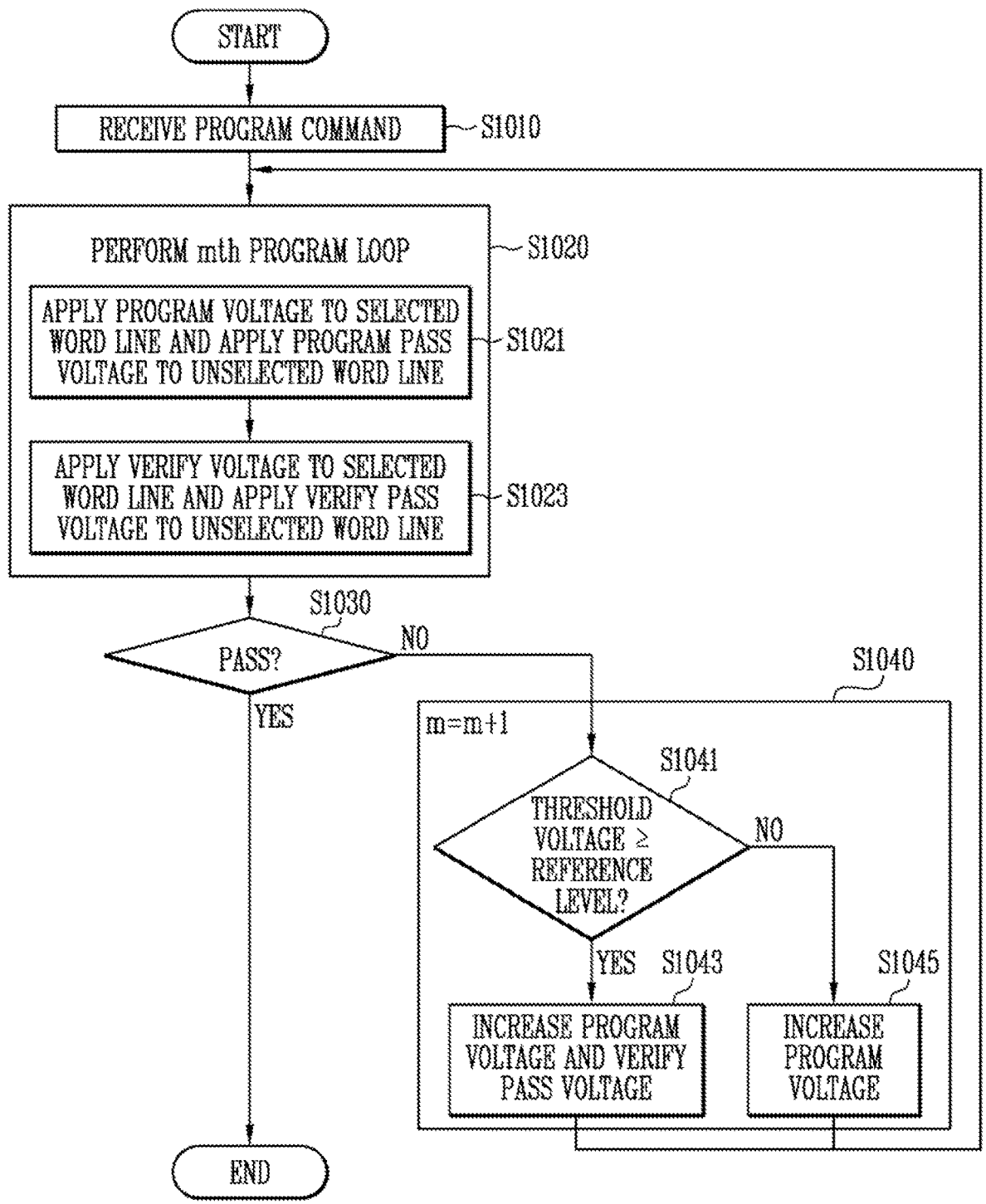
FIG. 10 is a detailed diagram illustrating operations of a memory device according to an embodiment of the present disclosure.

FIG. 10 is a detailed diagram illustrating operations of the memory device 100 according to an embodiment of the present disclosure.

Referring to FIG. 10, the memory device 100 may receive a program command at step S1010. The memory device 100 may receive an address along with the program command. In addition, the memory device 100 may receive data to be stored in the memory block.

When the memory device 100 receives the program command, the memory device 100 may perform a program operation corresponding to the program command. In other words, the memory device 100 may perform an mth program loop at step S1020. More specifically, the memory device 100 may apply a program voltage to a selected word line determined by the address and may apply a program pass voltage to unselected word lines in parallel at step S1021. Subsequently, the memory device 100 may apply a verify voltage to a selected word line and may apply a verify pass voltage to unselected word lines in parallel at step S1023.

The memory device 100 may terminate the program operation when the program operation has passed (S1030, YES). The memory device 100 may output a pass signal indicating that the program operation has passed.

In an embodiment, when the program operation does not pass (S1030, NO), the memory device 100 may increase a level of a voltage using an (m+1)th program loop at step S1040.

For example, when the program operation does not pass (S1030, NO), and if a threshold voltage of at least one memory cell coupled to the selected word line is greater than or equal to the reference level (S1041, YES), then the memory device 100 may increase a level of the program voltage and a level of the verify pass voltage which are applied during an (m+1)th program loop at step S1043.

For example, when the program operation does not pass (S1030, NO), and if a threshold voltage of at least one memory cell coupled to the selected word line is less than the reference level (S1041, NO), then the memory device 100 may increase the level of the program voltage applied during the (m+1)th program loop at step S1045.

Figure 11:
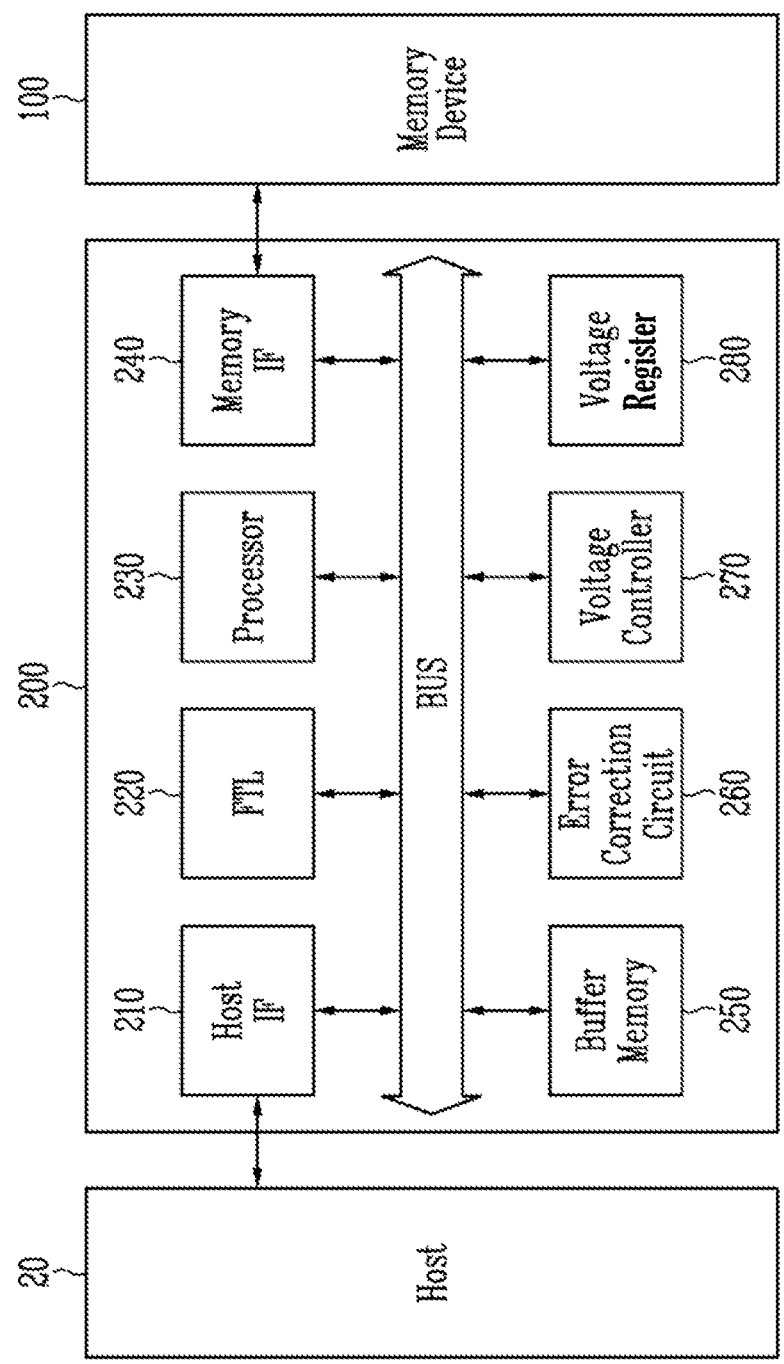
FIG. 11 is a diagram illustrating the structure of a memory controller according to an embodiment of the present disclosure.

FIG. 11 is a diagram illustrating the structure of the memory controller 200 according to an embodiment of the present disclosure.

Referring to FIG. 11, the memory controller 200 may include a host interface 210, a flash translation layer (FTL) 220, a processor 230, a memory interface 240, a buffer memory 250, and an error correction circuit 260.

The host interface 210 may communicate with the host 20 according to various types of communication specifications. For example, the host interface 210 may perform communication according to various types of communication specifications such as a universal serial bus (USB), a multimedia card (MMC), an embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), and Universal asynchronous receiver/transmitter (UART).

The host interface 210 may receive various requests from the host 20. Examples of these requests may include a read request for instruction to store data, a read request for instruction to output the stored data, and an erase request for instruction to erase the stored data. The host interface 210 may transfer the received request to the processor 230.

The host interface 210 may receive data and a logical address from the host 20. In addition, the host interface 210 may transfer the received data to the buffer memory 250. The host interface 210 may transfer the received logical address to the flash translation layer 220 or the processor 230.

The flash translation layer 220 may store an address mapping table which represents a mapping relationship between a logical address and a physical address. When the flash translation layer 220 receives the logical address from the host 20, the flash translation layer 220 may transfer a physical address of the memory device 100 corresponding to the received logical address to the processor 230.

The processor 230 may control the general operation of the memory controller 200. When power is applied to the memory device 100, the processor 230 may execute an instruction. The instruction may be, for example, firmware FW. The firmware FW may include a host interface layer and a flash interface layer FIL. The host interface layer may control communication between the host 20 and the host interface 210. In other words, the operations of the host interface 210 may be controlled by a host interface layer HIL. The flash interface layer may control communication between the memory interface 240 and the memory device 100. The processor 230 and the flash translation layer 220 may be provided separately. However, this is merely an example. The operations of the flash translation layer 220 may be performed by the processor 230.

The memory interface 240 may exchange commands, addresses, and data between the memory controller 200 and the memory device 100 through a channel. For example, the memory interface 240 may transfer a command and an address which are output from the processor 230 and data which is output from the buffer memory 250 to the memory device 100 through a channel. The memory interface 240 may transfer the data received from the memory device 100 to the buffer memory 250 through the channel.

For example, the memory interface 240 may transfer a program command, an address, and data which is stored in the buffer memory 250 to the memory device 100. The memory device 100 may store data in a page of a memory block corresponding to the address. In another example, the memory interface 240 may transfer a read command and an address to the memory device 100. The memory interface 240 may receive the data stored in the page of the memory block corresponding to the address from the memory device 100. In another example, the memory interface 240 may transfer an erase command and an address to the memory device 100. The memory device 100 may erase the stored data from the memory block corresponding to the address.

The buffer memory 250 may temporarily store the data received from the host 20. The data received from the host may be stored in the memory device 100 in response to the program command. For example, the buffer memory 250 may store the data which is received from the host 20. After the buffer memory 250 stores the received data in the memory device 100, the data stored in the buffer memory 250 may be erased. For example, when the buffer memory 250 receives a pass signal indicating that a program operation passes from the memory device 100, the buffer memory 250 may erase the data stored in the buffer memory 250.

The buffer memory 250 may include Static random access memory (Static RAM) which keeps retaining stored information as long as power is supplied, or Dynamic RAM (DRAM) which is required to be periodically refreshed to retain the stored information. According to an embodiment, a region of the buffer memory 250 may be configured as working memory, or may serve as cache memory. According to an embodiment, firmware may be stored in one area of the buffer memory 250. The firmware stored in the buffer memory 250 may be driven by the processor 230. However, this is merely an example. The memory controller 200 may further include at least one of working memory, cache memory, and memory storing firmware which are provided separately from the buffer memory 250.

The error correction circuit 260 may perform an encoding operation of generating a parity bit of data to be transferred to the memory device 100 using an error correction code. The error correction circuit 260 may perform an encoding operation on each of a plurality of chunk data into which data is divided. The data may have a size corresponding to a page and the chunk data may have a size corresponding to a chunk. The parity bit may refer to a code which is used to detect or correct an error bit in the data. For example, the parity bit may be inserted at the start or end of a data bit of the actual data. In another example, the parity bit may be inserted at positions corresponding to the powers of two such as 1, 2, 4, 8, 16, . . . , and the data bit for the actual data may be arranged at the remaining positions.

The error correction circuit 260 may perform a decoding operation of detecting and correcting an error bit included in data which is read based on a parity bit included in data which is read from the memory device 100. For example, the error correction circuit 260 may perform an encoding operation or a decoding operation based on coded modulation such as a low density parity check (LDPC) code, a Bose-Chaudhuri-Hocquenghem (BCH) code, a turbo code, a Reed-Solomon code, a convolution code, a recursive systematic code (RSC), trellis-coded modulation (TCM), Block coded modulation (BCM), and a Hamming code. The decoding operation may be referred to as an error correction operation.

The error correction circuit 260 may detect an error bit included in the data using the parity bit included in the data. For example, the error correction circuit 260 may detect the error bit included in the data using various methods such as parity check, block sum check, and cyclic redundancy check (CRC).

The error correction circuit 260 may correct the error bit in the data when the number of error bits of the data is less than a reference number. On the other hand, the error correction circuit 260 may not correct the error bit in the data when the number of error bits of the data is greater than or equal to the reference number. The reference number may indicate capabilities for correcting the error bit.

In the above-described embodiment, the levels of the program voltage, the verify voltage and the verify pass voltage may be controlled by the memory device 100. However, this is merely an example. At least one of the levels of the program voltage, the verify voltage, and the verify pass voltage may be controlled by the memory controller 200.

According to an embodiment, the memory controller 200 may include a voltage controller 270 and a voltage register 280.

The voltage controller 270 may adjust a level of an operating voltage of the memory device 100. For example, the voltage controller 270 may transfer a voltage control signal for adjusting the level of the operating voltage of the memory device 100 to the memory device 100.

The voltage register 280 may store voltage information which includes the levels of the program voltage, the verify voltage, and the verify pass voltage for each of the plurality of loops.

According to an embodiment, when the processor 230 receives a program command and an address, the processor 230 may control the memory device 100 to repeatedly perform a program loop including a program pulse operation and a verify operation. The processor 230 may receive the program command and the address from the host 20. The address may be a logical address.

The program pulse operation may refer to an operation of applying a program voltage to a selected word line determined by the address and applying a program pass voltage to unselected word lines. The selected word line may be determined by a physical address into which the logical address is converted. The verify operation may refer to an operation of applying a verify voltage to the selected word line and applying a verify pass voltage to the unselected word lines.

In addition, the voltage controller 270 may increase a level of the program voltage applied to the selected word line and a level of the verify pass voltage applied to the unselected word lines whenever the program loop is performed until the voltage controller 270 receives a pass signal indicating that the program pulse operation has passed.

Figure 12:
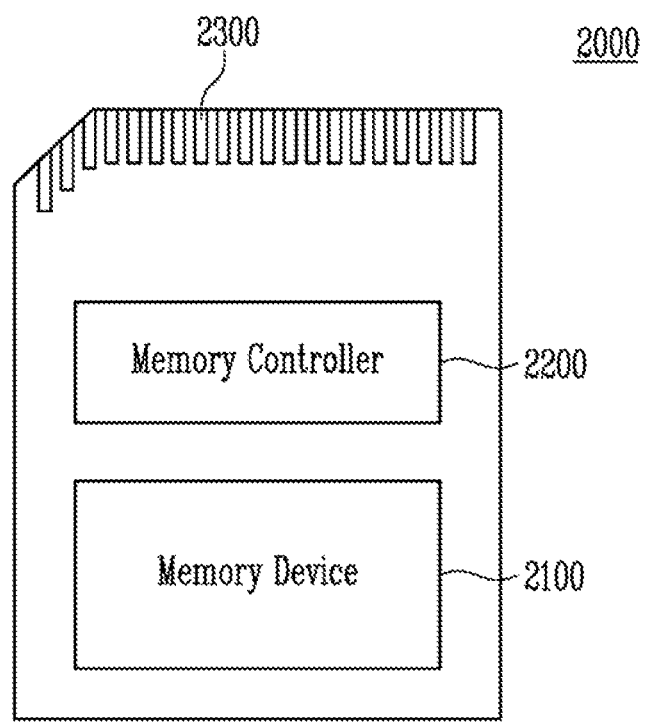
FIG. 12. is a block diagram illustrating a memory card to which a memory system is applied according to an embodiment of the present disclosure is applied.

FIG. 12 is a block diagram illustrating a memory card 2000 to which a memory system is applied according to an embodiment of the present disclosure.

Referring to FIG. 12, the memory card 2000 may include a memory device 2100, a memory controller 2200, and a connector 2300.

The memory device 2100 may perform a program operation of storing data, a read operation of reading data, or an erase operation of erasing data. For example, the memory device 2100 may include various types of non-volatile memory such as Electrically Erasable and Programmable ROM (EEPROM), NAND flash memory, NOR flash memory, Phase-change RAM (PRAM), Resistive RAM (Re-RAM), Ferroelectric RAM (FRAM), and Spin Transfer Torque Magnetic RAM (STT-MRAM). The description of the memory device 100 with reference to FIG. 1 may be applicable to the memory device 2100, and overlapping repeated description thereof will be omitted.

The memory controller 2200 may control the memory device 2100. For example, the memory controller 2200 may execute an instruction for controlling the memory device 2100. The memory controller 2200 may control the memory device 2100 to perform a program operation, a read operation, or an erase operation. The memory controller 2200 may transfer data or commands through communication between the memory device 2100 and the host. For example, the memory controller 2200 may include components such as a Random Access Memory (RAM), a processing unit, a host interface, a memory interface, and an error correction unit. The description of the memory controller 200 with reference to FIG. 1 may be applicable to the memory controller 2200. A redundant description thereof will be omitted.

The memory controller 2200 may communicate with an external device through the connector 2300. The memory controller 2200 may communicate with an external device (e.g., the host) according to predetermined communication specifications. For example, the memory controller 2200 may be configured to communicate with an external device through at least one of various communication specifications such as a universal serial bus (USB), a multimedia card (MMC), an embedded MMC (eMMC), peripheral component interconnection (PCI), PCI-express (PCI-E), advanced technology attachment (ATA), serial-ATA (SATA), parallel-ATA (PATA), an small computer system interface (SCSI), an enhanced small disk interface (ESDI), integrated drive electronics (IDE), Firewire, universal flash storage (UFS), WIFI, Bluetooth, and NVMe. For example, the connector 2300 may be defined by at least one of the above-described communication specifications. The memory controller 2200 and the memory device 2100 may be integrated into a single semiconductor device to form a memory card. For example, the memory device 2100 and the memory controller 2200 may be integrated into a single semiconductor device and form a memory card, such as a personal computer memory card international association (PCMCIA), a compact flash (CF) card, a smart media card (SM or SMC), a memory stick, a multimedia card (MMC, RS-MMC, MMCmicro, or eMMC), an SD card (SD, miniSD, microSD, or SDHC), a universal flash storage (UFS), and the like.

Figure 13:
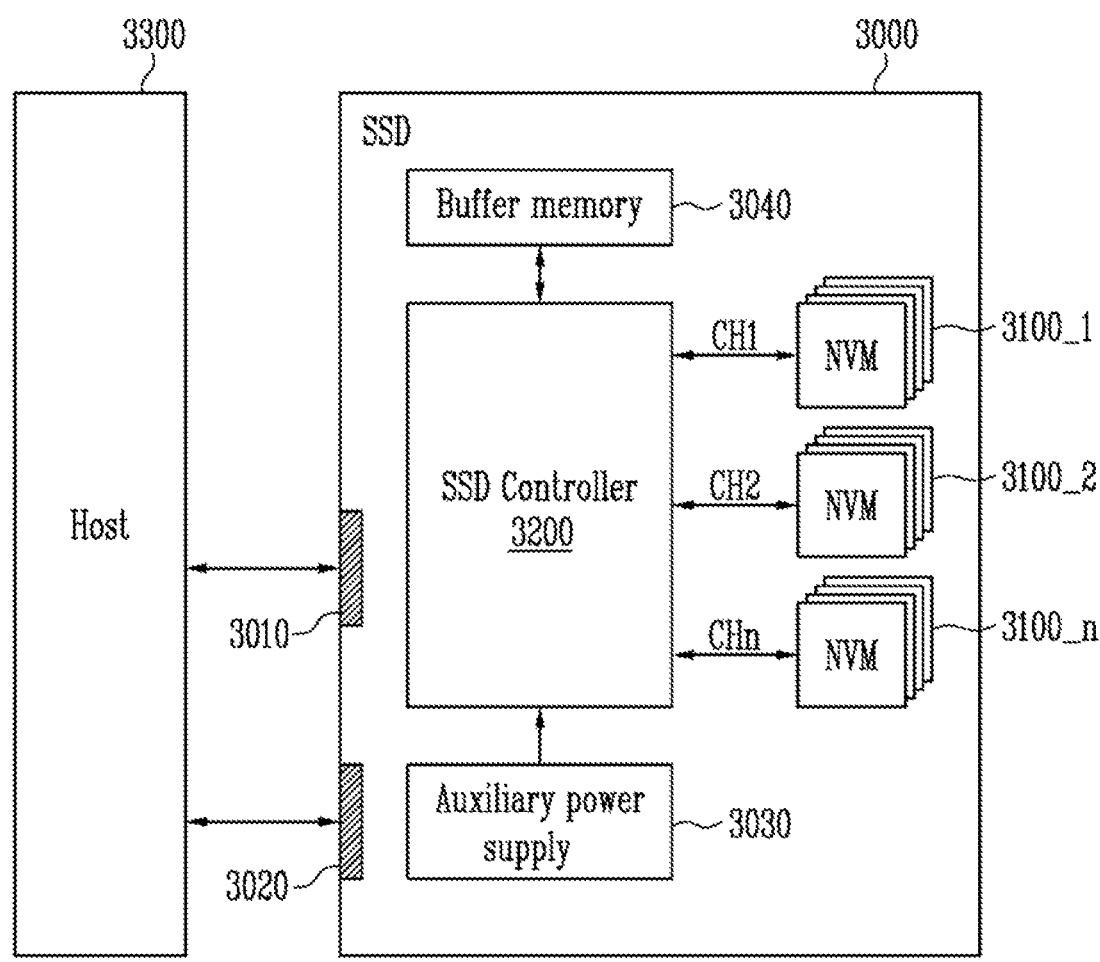
FIG. 13 is a block diagram illustrating a solid state drive (SSD) system to which a memory system is applied according to an embodiment of the present disclosure.

FIG. 13 is a block diagram illustrating a solid system drive (SSD) system 3000 to which a memory system is applied according to an embodiment of the present disclosure.

Referring to FIG. 13, the SSD system 3000 may include a plurality of non-volatile memory devices 3100_1 to 3100_n, an SSD controller 3200, a signal connector 3010, an auxiliary power supply 3030, and a buffer memory 3040.

The SSD system 3000 may communicate with a host 3300 through the signal connector 3010. The signal connector 3010 may be embodied in the form of an interface according to various types of communication methods. For example, the signal connector 3010 may be one of the interfaces according to various communication methods, such as a Serial ATA (SATA) interface, a mini-SATA (mSATA) interface, a PCI Express (PCIe) interface, and an M.2 interface.

The plurality of first non-volatile memory devices 3100_1 may be coupled to the SSD controller 3200 through a first channel CH1, the plurality of second non-volatile memory devices 3100_2 may be coupled to the SSD controller 3200 through a second channel CH2, and the plurality of nth non-volatile memory devices 3100_n may be coupled to the SSD controller 3200 through an nth channel CHn. Therefore, the SSD controller 3200 may perform parallel communication with the non-volatile memory devices through independent channels.

The description of the memory device 100 with reference to FIG. 1 may be applicable to each of the plurality of memory devices 3100_1 to 3100_n. A redundant description thereof will be omitted. The description of the memory controller 200 with reference to FIG. 1 may be applicable to the SSD controller 3200.

The SSD system 3000 may receive an external power from the host 3300 through a power connector 3020. The auxiliary power supply 3030 may be coupled to the host 3300 through the power connector 3020. The auxiliary power supply 3030 may receive power from the host 3300 and may be charged with the power. When the power supply from the host 3300 is not properly made, the auxiliary power supply 3030 may supply power of the SSD system 3000. According to an embodiment, the auxiliary power supply 3030 may be located inside or outside the SSD system 3000. For example, the auxiliary power supply 3030 may be located on the main board and supply auxiliary power to the SSD system 3000.

The buffer memory 3040 may operate as a buffer memory of the SSD system 3000. For example, the buffer memory 3040 may temporarily store the data received from the host 3300, or the data received from the plurality of non-volatile memory devices 3100_1 to 3100_n, or may temporarily store meta data (e.g., a mapping table) of the non-volatile memory devices 3100_1 to 3100_n. The buffer memory 3040 may include volatile memory such as DRAM, SDRAM, DDR SDRAM, LPDDR SDRAM, and GRAM, or non-volatile memory devices such as FRAM, ReRAM, STT-MRAM, and PRAM.

Figure 14:
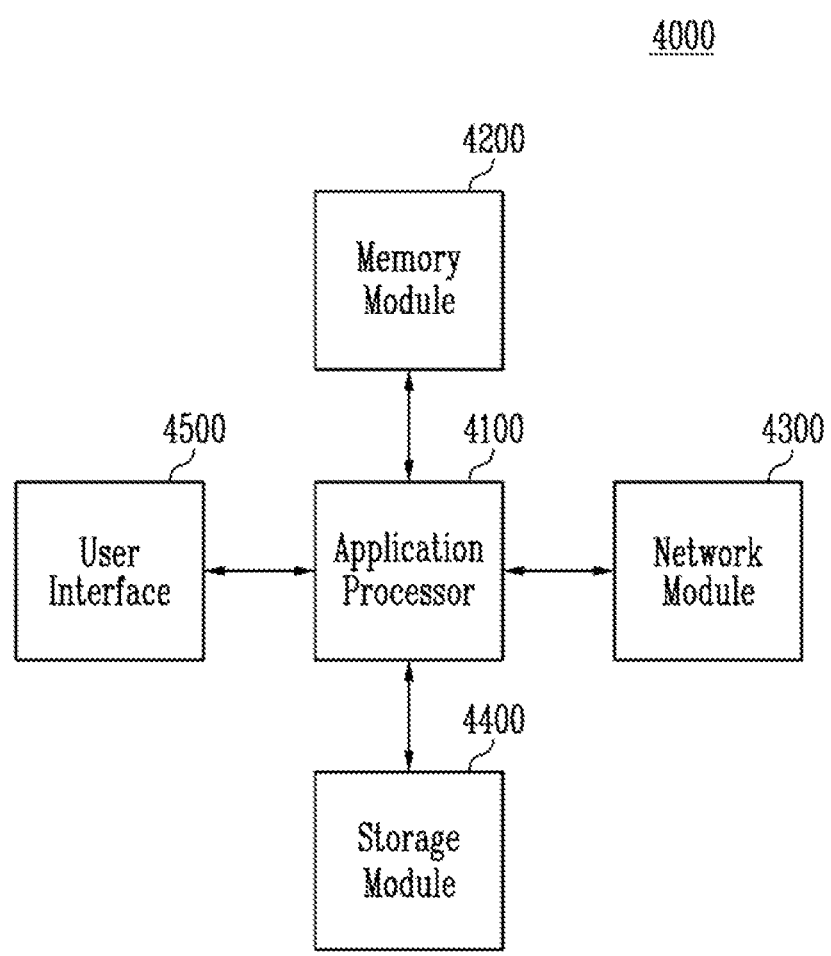
FIG. 14 is a block diagram illustrating a user system to which a memory system is applied according to an embodiment of the present disclosure.

FIG. 14 is a block diagram illustrating a user system 4000 to which a memory system according to an embodiment is applied.

Referring to FIG. 14, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile random access memories (RAMs) such as DRAM, SDRAM, DDR SDRAM, DDR2 SDRAM, DDR3 SDRAM, LPDDR SDARM, LPDDR2 SDRAM, and LPDDR3 SDRAM, or non-volatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or Wi-Fi. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. For example, the storage module 4400 may be embodied as a non-volatile semiconductor memory device using, for exaple, Phase-change RAM (PRAM), Magnetic RAM (MRAM), Resistive RAM (ReRAM), NAND flash memory, NOR flash memory, or NAND flash memory having a three-dimensional (3D) structure. For example, the storage module 4400 may be provided as a removable storage medium (i.e., removable drive), such as a memory card or an external drive of the user system 4000.

According to an embodiment, the description of the memory system 10 with reference to FIG. 1 may be applicable to the storage module 4400. For example, the storage module 4400 may include a plurality of non-volatile memory devices. The description of the memory device 100 with reference to FIG. 1 may be applicable to each of the plurality of non-volatile memory devices.

The user interface 4500 may include interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

According to the present disclosure, a memory device preventing generation of under-programmed memory cells, a memory system including the memory device, and a method of operating the same may be provided. In addition, the reliability of a verify operation for verifying a program pulse operation may be improved.

What is claimed is:

1. A memory device, comprising:
a memory block including a plurality of pages coupled to a plurality of word lines, respectively;
a peripheral circuit configured to perform a program loop including a program pulse operation of applying a program voltage to a selected word line corresponding to an address, among the plurality of word lines, and a verify operation of applying at least one verify voltage corresponding to the program voltage to the selected word line and applying a verify pass voltage to unselected word lines; and
control logic configured to:
control the peripheral circuit to repeatedly perform a next program loop including the program pulse operation and the verify operation until a pass signal indicating that the program pulse operation has passed according to the verify operation is received;
increase a level of the verify pass voltage applied to the unselected word lines whenever the peripheral circuit performs the next program loop when threshold voltages of memory cells included in a page coupled to the selected word line are greater than a reference level, wherein the unselected word lines include both word lines coupled to programed pages and word lines coupled to erased pages.

2. The memory device of claim 1, wherein the control logic is configured to control the peripheral circuit to perform the next program loop in which the level of the verify pass voltage is maintained when the threshold voltages of the memory cells are less than the reference level.

3. The memory device of claim 1, wherein the control logic is configured to:
adjust a value of a voltage increase based on a number of program-completed pages among the plurality of pages included in the memory block; and
increase the level of the verify pass voltage according to the value of the voltage increase whenever the peripheral circuit performs the next program loop when the threshold voltages of the memory cells are greater than the reference level.

4. The memory device of claim 3, wherein the control logic is configured to:
maintain the value of the voltage increase when a ratio of the number of program-completed pages and a number of the plurality of pages is less than a reference value; and
adjust the value of the voltage increase according to a difference between the ratio and the reference value when the ratio is greater than the reference value.

5. The memory device of claim 1, wherein the control logic is configured to, whenever the peripheral circuit performs the next program loop when the threshold voltages of the memory cells are greater than the reference level:
increase the level of the verify pass voltage applied to a word line coupled to a program-completed page, among the unselected word lines, by a fist increase; and
increase the level of the verify pass voltage applied to a word line coupled to an erased page by a second increase smaller than the first increase.

6. The memory device of claim 1, wherein the unselected word lines include remaining word lines except for the selected word line among the plurality of word lines.

7. The memory device of claim 1, wherein the control logic includes a voltage register capable of storing verify voltage information including a level of the program voltage, a level of the verify voltage, and the level of the verify pass voltage with respect to each of a plurality of program loops.

8. The memory device of claim 1, wherein the control logic is configured to increase a level of the program voltage whenever the peripheral circuit performs the next program loop until the pass signal is received.

9. The memory device of claim 1, wherein the control logic is configured to control the peripheral circuit to apply a program pass voltage to the unselected word lines during the program pulse operation.

10. A memory system, comprising:
a memory device including a plurality of pages coupled to a plurality of word lines, respectively; and
a memory controller configured to:
control the memory device to repeatedly perform a program loop including a program pulse operation and a verify operation when a program command and an address are received, the program pulse operation comprising applying a program voltage to a selected word line corresponding to the address, among the plurality of word lines, and applying a program pass voltage to unselected word lines, the verify operation comprising applying a verify voltage to the selected word line and applying a verify pass voltage to the unselected word lines; and
increase a level of the program voltage applied to the selected word line and a level of the verify pass voltage applied to the unselected word lines whenever the memory device performs the program loop until a pass signal is received indicating that the program pulse operation has passed according to the verify operation, wherein the unselected word lines include both word lines coupled to programed pages and word lines coupled to erased pages.

11. A method of operating a memory device including a memory block, the method comprising:
receiving a program command and an address;
performing a program pulse operation and a verify operation sequentially during a first program loop, the program pulse operation comprising applying a program voltage to a selected word line corresponding to the address, among a plurality of word lines coupled to a plurality of pages included in the memory block, respectively, the verify operation comprising applying a verify voltage corresponding to the program voltage to the selected word line and applying a verify pass voltage to unselected word lines; and
performing the program pulse operation in which a level of the program voltage is increased and the verify operation in which a level of the verify pass voltage is increased sequentially during a second program loop when threshold voltages of memory cells included in a page coupled to the selected word line are greater than a reference level and less than a target level higher than the reference level, wherein the unselected word lines include both word lines coupled to programed pages and word lines coupled to erased pages.

12. The method of claim 11, further comprising sequentially performing the program pulse operation in which the level of the program voltage is increased and the verify operation in which the level of the verify pass voltage is maintained during the second program loop when the threshold voltages of the memory cells are less than the reference level.

13. The method of claim 11, further comprising adjusting an increase of the verify pass voltage based on a number of program-completed pages among the plurality of pages included in the memory block.

14. The method of claim 13, wherein adjusting the increase of the verify pass voltage comprises:
   maintaining the increase at a constant value when a ratio of the number of program-completed pages and a number of the plurality of pages is less than a reference value; and
   adjusting the increase in proportion to a difference between the ratio and the reference value when the ratio is greater than the reference value.

15. The method of claim 11, further comprising sensing the threshold voltages of the memory cells included in the page coupled to the selected word line according to the verify operation during the first program loop.

16. The method of claim 11, further comprising sequentially performing the program pulse operation in which the level of the program voltage is increased and the verify operation in which the level of the verify pass voltage is increased during a third program loop when the threshold voltages of the memory cells included in the page coupled to the selected word line are greater than the reference level and less than the target level.

17. The method of claim 11, further comprising outputting a pass signal of a program operation corresponding to the program command when the threshold voltages of the memory cells included in the page coupled to the selected word line are greater than the target level.

18. The method of claim 11, further comprising storing voltage information including the level of the program voltage, a level of the verify voltage, and the level of the verify pass voltage with respect to each of a plurality of program loops including the first and second program loops.

19. The method of claim 11, further comprising applying a program pass voltage to the unselected word lines during the program pulse operation.

\* \* \* \* \*